(12) United States Patent
Adachi et al.

(10) Patent No.: US 10,314,168 B2
(45) Date of Patent: Jun. 4, 2019

(54) PRINTED WIRING BOARD

(71) Applicant: IBIDEN CO., LTD., Ogaki (JP)

(72) Inventors: Takema Adachi, Ogaki (JP); Toshihide Makino, Ogaki (JP); Hidetoshi Noguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 16/167,850

(22) Filed: Oct. 23, 2018

(65) Prior Publication Data

US 2019/0124768 A1     Apr. 25, 2019

(30) Foreign Application Priority Data

Oct. 24, 2017   (JP) ................................. 2017-204929

(51) Int. Cl.
*H05K 1/11*     (2006.01)
*H05K 3/46*     (2006.01)
*H05K 1/02*     (2006.01)
*H05K 3/42*     (2006.01)

(52) U.S. Cl.
CPC .......... *H05K 1/116* (2013.01); *H05K 1/0271* (2013.01); *H05K 3/429* (2013.01); *H05K 3/4647* (2013.01); *H05K 3/4661* (2013.01)

(58) Field of Classification Search
CPC ...... H05K 1/116; H05K 1/0271; H05K 1/111; H05K 1/112; H05K 1/113; H05K 1/114; H05K 1/115; H05K 3/429; H05K 3/4647; H05K 3/4661
See application file for complete search history.

(56) References Cited

U.S. PATENT DOCUMENTS

| 2009/0053459 A1* | 2/2009 | Hirose | H01L 23/49811 428/76 |
| 2015/0223338 A1* | 8/2015 | Noda | H01L 23/5383 361/771 |
| 2015/0257261 A1* | 9/2015 | Kitagawa | H05K 1/0298 361/688 |

(Continued)

FOREIGN PATENT DOCUMENTS

JP         2012-156525 A      8/2012

*Primary Examiner* — Timothy J Thompson
*Assistant Examiner* — Amol H Patel
(74) *Attorney, Agent, or Firm* — Oblon, McClelland, Maier & Neustadt, L.L.P.

(57) ABSTRACT

A printed wiring board includes a core substrate and first and second build-up layers. The substrate includes a core layer, through-hole conductors formed in through holes such that each through hole has first opening tapering from first toward second surface of the core layer, and second opening tapering from second toward first surface of the core layer, and first and second through-hole lands directly connected to the through-hole conductors. Each build-up layer includes an insulating layer, via conductors, via lands, an outermost insulating layer, an outermost conductor layer, and outermost via conductors. Each of the through-hole lands, via lands and outermost conductor layers includes a metal foil, a seed layer and an electrolytic plating film. The foils have mat surfaces such that the mat surfaces of the via lands has ten-point average roughness smaller than ten-point average roughness of the mat surfaces of the through-hole lands and outermost conductor layers.

20 Claims, 8 Drawing Sheets

(56) References Cited

U.S. PATENT DOCUMENTS

2016/0021753 A1* 1/2016 Tomikawa ............. H05K 1/185
 361/761
2016/0143134 A1* 5/2016 Tomikawa ........... H05K 1/0204
 174/255

* cited by examiner

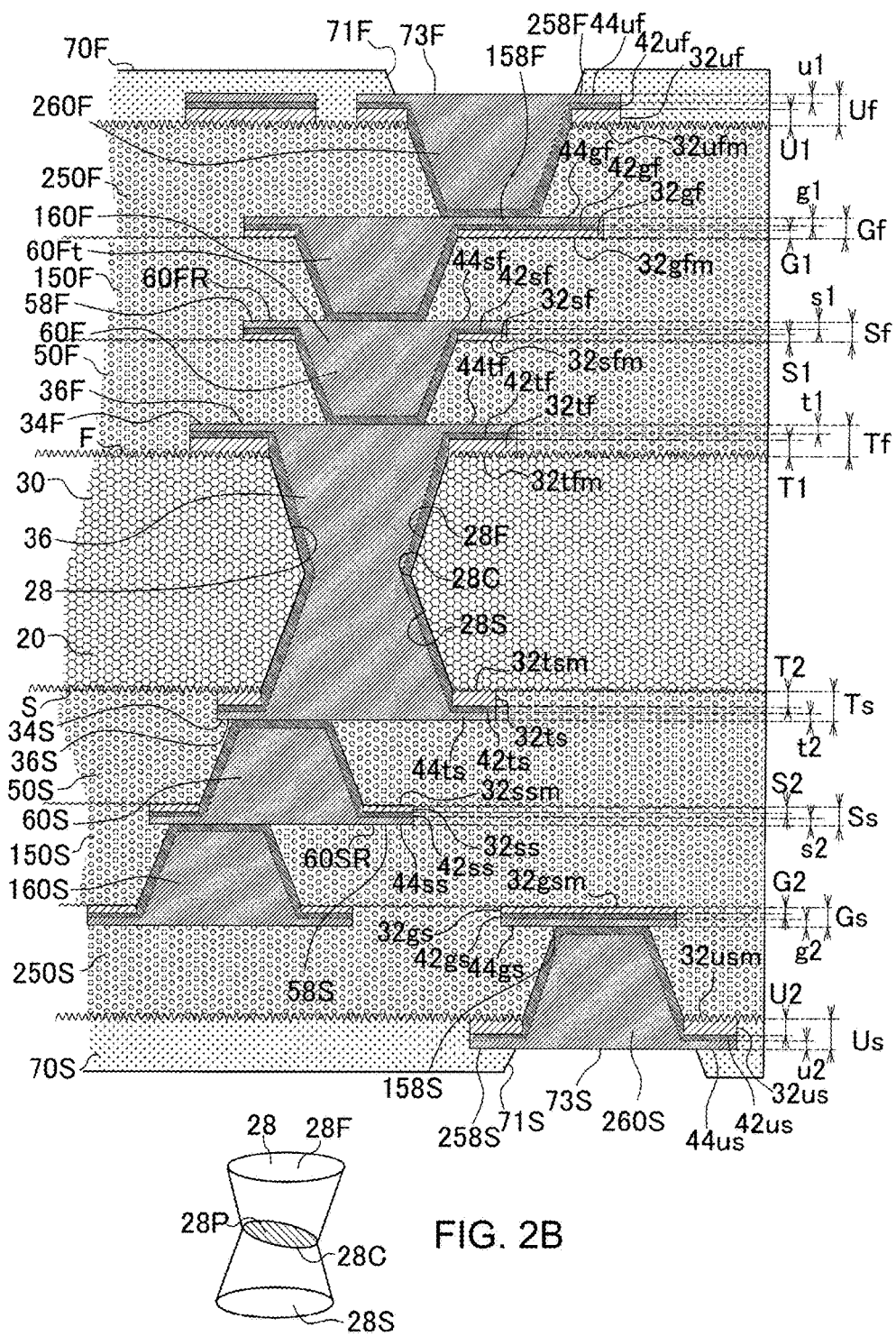

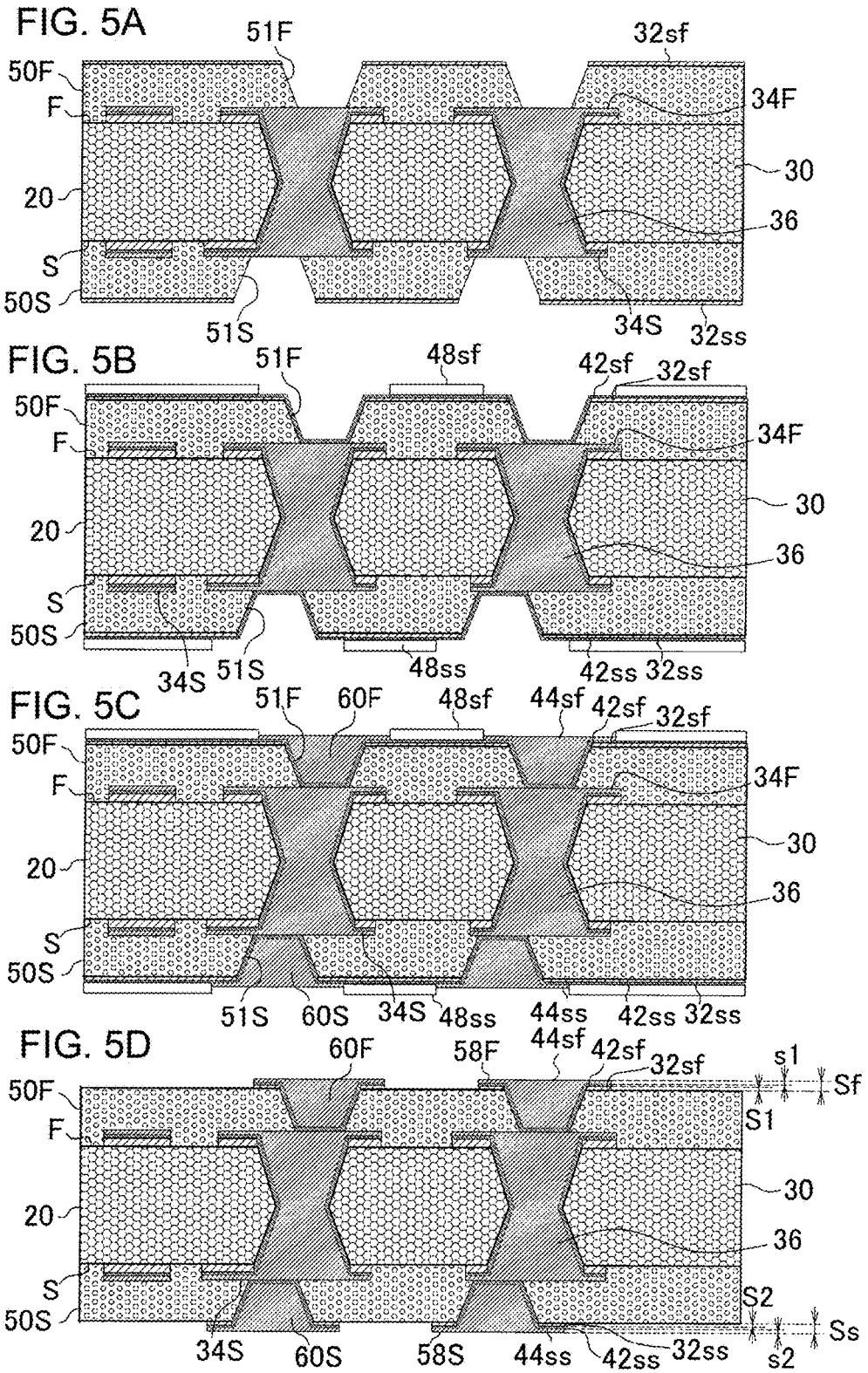

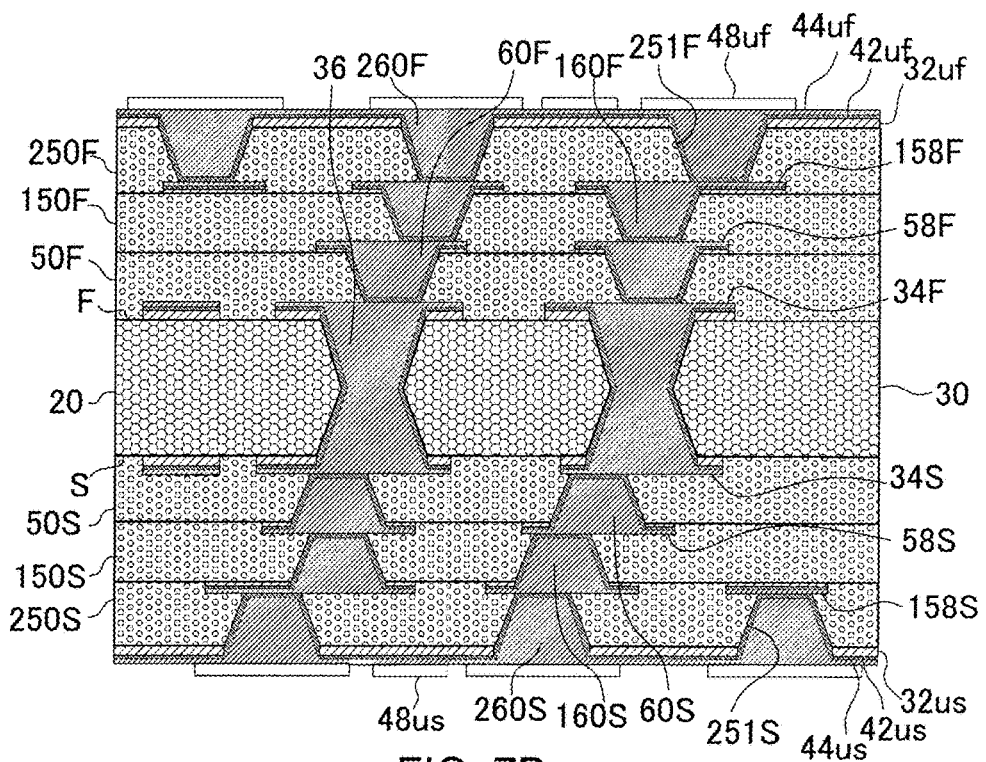
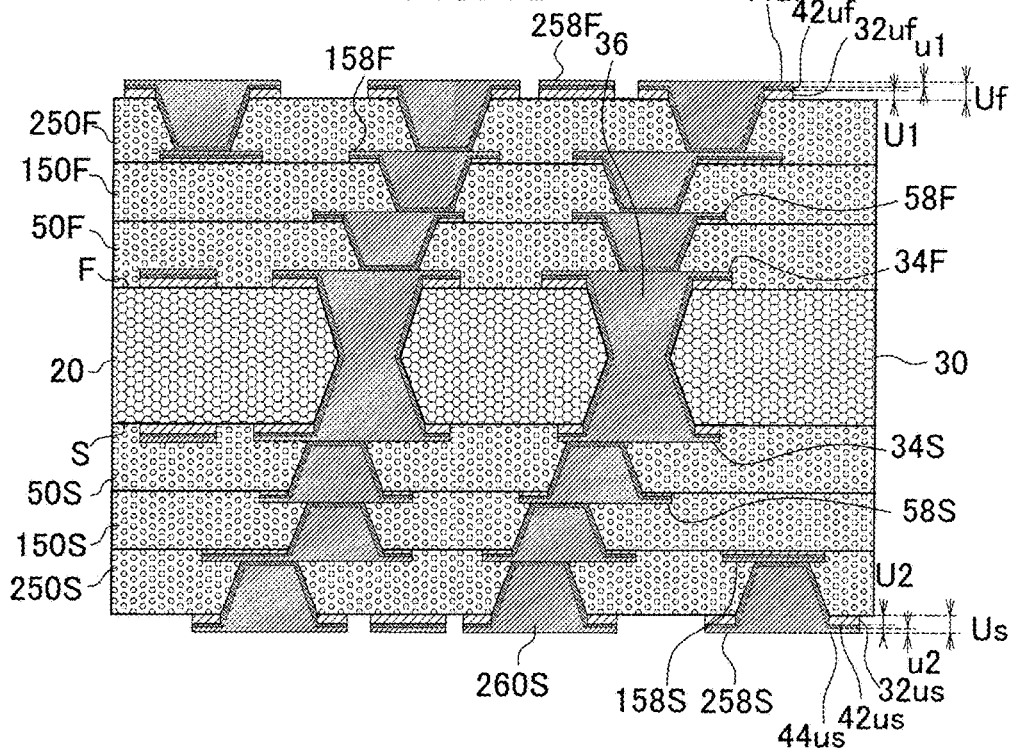

PRINTED WIRING BOARD

CROSS-REFERENCE TO RELATED APPLICATIONS

The present application is based upon and claims the benefit of priority to Japanese Patent Application No. 2017-204929, filed Oct. 24, 2017, the entire contents of which are incorporated herein by reference.

BACKGROUND OF THE INVENTION

Field of the Invention

The present invention relates to a printed wiring board having a core substrate and conductor layers and resin insulating layers that are alternately laminated on the core substrate.

Description of Background Art

Japanese Patent Laid-Open Publication No. 2012-156525 describes a multilayer printed wiring board and a method for manufacturing the multilayer printed wiring board. In the printed wiring board, insulating layers and conductor layers are alternately laminated, and adjacent conductor layers are connected to each other by via holes formed in the insulating layers. The entire contents of this publication are incorporated herein by reference.

SUMMARY OF THE INVENTION

According to one aspect of the present invention, a printed wiring board includes a core substrate, a first build-up layer formed on a first surface side of the core substrate, and a second build-up layer formed on a second surface side of the core substrate on the opposite side with respect to the first surface side. The core substrate includes a core layer having through holes, through-hole conductors formed in the through holes respectively such that each of the through holes has a first opening tapering from a first surface of the core layer toward a second surface of the core layer on the opposite side with respect to the first surface, and a second opening tapering from the second surface of the core layer toward the first surface of the core layer, first through-hole lands formed on the first surface of the core layer such that the first through-hole lands are directly connected to the through-hole conductors respectively, and second through-hole lands formed on the second surface of the core layer such that the second through-hole lands are directly connected to the through-hole conductors respectively. The first build-up layer includes a first resin insulating layer, first via conductors penetrating through the first resin insulating layer and connecting to the first through-hole lands respectively, first via lands formed on the first resin insulating layer and directly connected to the first via conductors respectively, an outermost first resin insulating layer formed on the first resin insulating layer, an outermost first conductor layer formed on the outermost first resin insulating layer, and outermost first via conductors penetrating through the outermost first resin insulating layer and electrically connecting to the first via conductors respectively. The second build-up layer includes a second resin insulating layer, second via conductors penetrating through the second resin insulating layer and connecting to the second through-hole lands respectively, second via lands formed on the second resin insulating layer and directly connected to the second via conductors respectively, an outermost second resin insulating layer formed on the second resin insulating layer, an outermost second conductor layer formed on the outermost second resin insulating layer, and outermost second via conductors penetrating through the outermost second resin insulating layer and electrically connecting to the second via conductors respectively. The through-hole conductors, first through-hole lands and second through-hole lands form through-hole structures such that each of the through-hole conductors has a joining area at an intersection between the first opening and the second opening. Each of the first through-hole lands, second through-hole lands, first via lands, second via lands, outermost first conductor layer and outermost second conductor layer includes a metal foil, a seed layer formed on the metal foil, and an electrolytic plating film formed on the seed layer. The metal foil of the first via lands has a mat surface at the first surface of the core layer, the metal foil of the second via lands has a mat surface on the second surface of the core layer, the metal foil of the first via lands has a mat surface on the first resin insulating layer, the metal foil of the second via lands has a mat surface on the second resin insulating layer, the metal foil of the outermost first conductor layer has a mat surface on the outermost first resin insulating layer, the metal foil of the outermost second conductor layer has a mat surface on the outermost second resin insulating layer such that the mat surface of the first via lands has a ten-point average roughness $RzI1$ of an unevenness that is smaller than ten-point average roughness $Rz1$, $Rz2$, $RzO1$, $RzO2$ of an unevenness of the mat surfaces of the first through-hole lands, second through-hole lands, outermost first conductor layer, and outermost second conductor layer, and that the mat surface of the second via lands has a ten-point average roughness $RzI2$ of an unevenness that is smaller than ten-point average roughness $Rz1$, $Rz2$, $RzO1$, $RzO2$ of an unevenness of the mat surfaces of the first through-hole lands, second through-hole lands, outermost first conductor layer, and outermost second conductor layer.

According to another aspect of the present invention, a printed wiring board includes: a core substrate including a core layer, a first conductor layer formed on a first surface of the core layer, and a second conductor layer formed on a second surface of the core layer on the opposite side with respect to the first surface; a first build-up layer formed on a first surface side of the core substrate and including a first resin insulating layer, an inner side first conductor layer formed on the first resin insulating layer, an outermost first resin insulating layer formed on the inner side first conductor layer, and an outermost first conductor layer formed on the outermost first resin insulating layer; and a second build-up layer formed on a second surface side of the core substrate on the opposite side with respect to the first surface side and including a second resin insulating layer, an inner side second conductor layer formed on the second resin insulating layer, an outermost second resin insulating layer formed on the inner side second conductor layer, and an outermost second conductor layer formed on the outermost second resin insulating layer. Each of the first conductor layer, second conductor layer, inner side first conductor layer, inner side second conductor layer, outermost first conductor layer and outermost second conductor layer includes a metal foil, a seed layer formed on the metal foil, and an electrolytic plating film formed on the outermost second seed layer. The metal foil of the first conductor layer has a mat surface at the first surface of the core layer, the metal foil of the second conductor layer has a mat surface on the second surface of the core layer, the metal foil of the inner side first conductor layer has a mat surface on the first resin insulating layer, the inner side second conductor layer has a mat surface on the second resin insulating layer, the outermost first conductor layer has a mat surface on the outermost first resin insulating layer, and the outermost second conductor layer metal foil has a mat surface on the outermost second resin insulating layer such that the mat surface of the inner side first conductor layer has a ten-point average roughness RzI1 of an unevenness that is smaller than ten-point average roughness Rz1, Rz2, RzO1, RzO2 of an unevenness of the mat surfaces of the first conductor layer, the second conductor layer, the outermost first conductor layer and the outermost second conductor layer, and that the mat surface of the inner side second conductor layer has a ten-point average roughness RzI2 of an unevenness that is smaller than ten-point average roughness Rz1, Rz2, RzO1, RzO2 of an unevenness of the mat surfaces of the first conductor layer, the second conductor layer, the outermost first conductor layer and the outermost second conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2A is an enlarged view of the printed wiring board of the embodiment;

FIG. 2B is an explanatory diagram of a through hole for a through-hole conductor;

FIG. 5A-5D are manufacturing process diagrams of the printed wiring board of the embodiment;

FIGS. 7A and 7B are manufacturing process diagrams of the printed wiring board of the embodiment.

DETAILED DESCRIPTION OF THE EMBODIMENTS

Figure 1A:
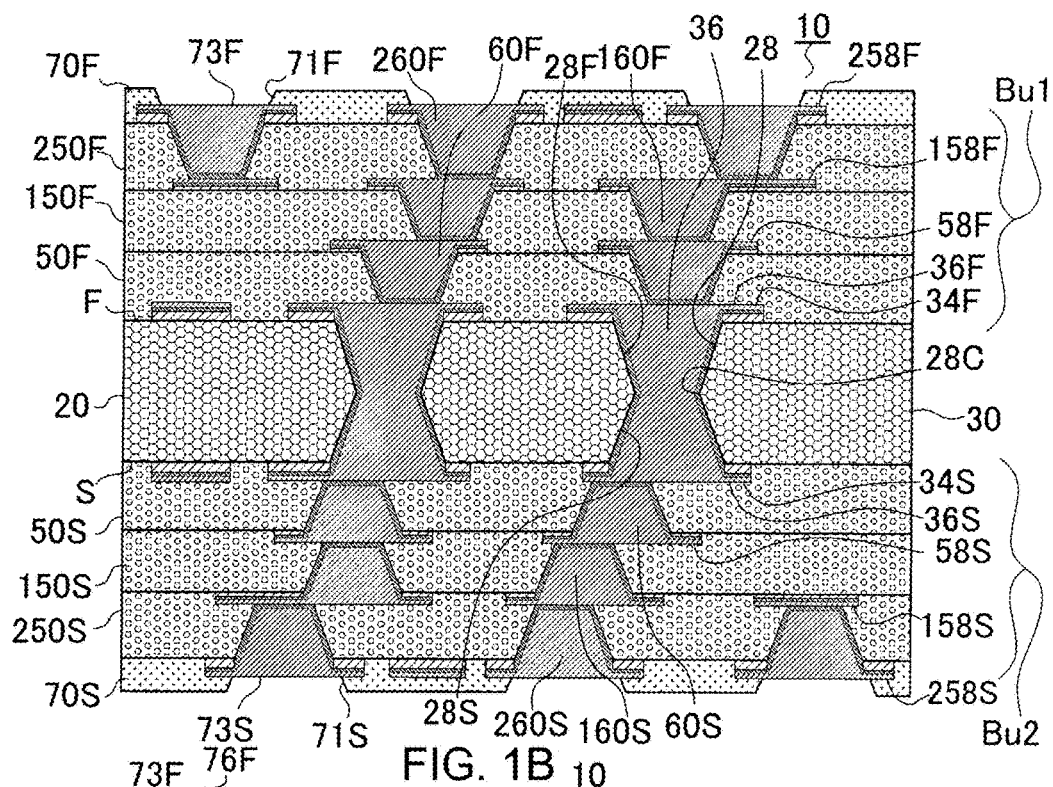
FIGS. 1A and 1B respectively illustrate cross-sectional views of a printed wiring board and a printed wiring board having solder bumps according to an embodiment of the present invention.

Embodiments will now be described with reference to the accompanying drawings, wherein like reference numerals designate corresponding or identical elements throughout the various drawings.

EMBODIMENT

FIG. 1A is a cross-sectional view of a printed wiring board according to an embodiment.

A printed wiring board 10 has a core substrate 30 having a first surface (F) and a second surface (S) on an opposite side with respect to the first surface (F), a first build-up layer (Bu1) formed on the first surface (F) of the core substrate 30, a second build-up layer (Bu2) formed on the second surface (S) of the core substrate 30, a first solder resist layer (70F) formed on the first build-up layer (Bu1), and a second solder resist layer (70S) formed on the second build-up layer (Bu2).

The core substrate 30 has a core layer 20, a first conductor layer (34F) formed on the first surface (F) of the core layer 20, and a second conductor layer (34S) formed on the second surface (S) of the core layer 20. The core substrate further has through-hole conductors 36 respectively formed in through holes 28 penetrating the core layer 20. The core layer 20 is formed of a resin such as an epoxy resin and a reinforcing material such as a glass cloth. The core layer may further contain inorganic particles such as silica particles. The first conductor layer (34F) and the second conductor layer (34S) are connected to each other via the through-hole conductors 36. The through-hole conductors 36 are formed by filling the through holes 28 with an electrolytic plating film.

The first build-up layer (Bu1) includes a first resin insulating layer (50F) formed on the first surface (F) of the core substrate 30 and on the first conductor layer (34F), an inner side first conductor layer (58F) formed on the first resin insulating layer (50F), a third resin insulating layer (150F) formed on the first resin insulating layer (50F) and on the inner side first conductor layer (58F), an inner side third conductor layer (158F) formed on the third resin insulating layer (150F), an outermost first resin insulating layer (250F) formed on the third resin insulating layer (150F) and on the inner side third conductor layer (158F), and an outermost first conductor layer (258F) formed on the outermost first resin insulating layer (250F). The first build-up layer further has via conductors (60F, 160F, 260F) respectively penetrating the resin insulating layers (50F, 150F, 250F).

The first conductor layer (34F) and the inner side first conductor layer (58F) are connected to each other via the first via conductors (60F) penetrating the first resin insulating layer (50F). The inner side first conductor layer (58F) and the inner side third conductor layer (158F) are connected to each other via the third via conductors (160F) penetrating the third resin insulating layer (150F). The inner side third conductor layer (158F) and the outermost first conductor layer (258F) are connected to each other via the outermost first via conductors (260F) penetrating the outermost first resin insulating layer (250F). The first solder resist layer (70F) having first openings (71F) is formed on the outermost first resin insulating layer (250F) and on the outermost first conductor layer (258F). The outermost first conductor layer (258F) exposed from the first openings (71F) forms first pads (73F) for mounting an electronic component.

The second build-up layer (Bu2) includes a second resin insulating layer (50S) formed on the second surface (S) of the core substrate 30 and on the second conductor layer (34S), an inner side second conductor layer (58S) formed on the second resin insulating layer (50S), a fourth resin insulating layer (150S) formed on the second resin insulating layer (50S) and on the inner side second conductor layer (58S), an inner side fourth conductor layer (158S) formed on the fourth resin insulating layer (150S), an outermost second resin insulating layer (250S) formed on the fourth resin insulating layer (150S) and on the inner side fourth conductor layer (158S), and an outermost second conductor layer (258S) formed on the outermost second resin insulating layer (250S). The second build-up layer (Bu2) further has via conductors (60S, 160S, 260S) respectively penetrating the resin insulating layers (50S, 150S, 250S). The second conductor layer (34S) and the inner side second conductor layer (58S) are connected to each other via the second via conductors (60S) penetrating the second resin insulating layer (50S). The inner side second conductor layer (58S) and the inner side fourth conductor layer (158S) are connected to each other via the fourth via conductors (160S) penetrating the fourth resin insulating layer (150S). The inner side fourth conductor layer (158S) and the outermost second conductor layer (258S) are connected to each other via the outermost second via conductors (260S) penetrating the outermost second resin insulating layer (250S). The second solder resist layer (70S) having second openings (71S) is formed on the outermost second resin insulating layer (250S) and on the outermost second conductor layer (258S). The outermost second conductor layer (258S) exposed from the second openings (71S) forms second pads (73S) for connecting to a motherboard or an electronic component.

The first resin insulating layer (50F), the second resin insulating layer (50S), the third resin insulating layer (150F), the fourth resin insulating layer (150S), the outermost first resin insulating layer (250F), and the outermost second resin insulating layer (250S) are each formed of a resin such as an epoxy resin, a reinforcing material such as a glass cloth, and inorganic particles such as silica particles.

The through holes 28 of the core substrate 30 are each formed by a first opening (28F) tapering from the first surface (F) toward the second surface (S) and a second opening (28S) tapering from the second surface (S) toward the first surface (F). The first opening (28F) and the second opening (28S) are connected to each other in the core layer 20. The through holes 28 or the through-hole conductors 36 each have a joining area (28P) at a joining place between the first opening (28F) and the second opening (28S). The joining area (28P) is illustrated in FIG. 2B. In FIG. 2B, oblique lines are drawn in the joining area (28P). An outer periphery of the joining area (28P) is referred to as a neck part (28C). In the embodiment, the joining area (28P) is formed at a substantially central portion of each of the through holes 28. Therefore, when the through-hole conductors 36 are respectively formed in the through holes 28 by plating, voids are unlikely to remain at central portions of the through holes 28. Connection reliability via the through-hole conductors 36 can be increased.

The first conductor layer (34F) has first through-hole lands (36F) respectively formed directly on the through-hole conductors 36. The first through-hole lands (36F) are respectively integrally formed with the through-hole conductors 36. Further, the first through-hole lands (36F) respectively extend on the first surface (F) of the core layer 20 so as to surround the through-hole conductors 36.

The second conductor layer (34S) has second through-hole lands (36S) respectively formed directly on the through-hole conductors 36. The second through-hole lands (36S) are respectively integrally formed with the through-hole conductors 36. Further, the second through-hole lands (36S) respectively extend on the second surface (S) of the core layer 20 so as to surround the through-hole conductors 36. The first through-hole lands (36F) and the second through-hole lands (36S) respectively extend directly from the through-hole conductors 36. Through-hole structures are formed by the through-hole conductors 36, the first through-hole lands (36F) and the second through-hole lands (36S).

Since the through-hole conductors 36 are respectively integrally formed with the through-hole lands (36F, 36S), connection reliability between the through-hole conductors 36 and the first conductor layer (34F) and connection reliability between the through-hole conductors 36 and the second conductor layer (34S) can be increased.

The first surface (F) of the core substrate 30 and the first surface (F) of the core layer 20 are the same surface, and the second surface (S) of the core substrate 30 and the second surface (S) of the core layer 20 are the same surface.

The conductor layers (34F, 58F, 158F, 258F, 34S, 58S, 158S, 258S) are each formed by a metal foil, a seed layer on the metal foil, and an electrolytic plating film on the seed layer. An example of a metal foil is copper foil, an example of a seed layer is an electroless copper plating film, and an example of an electrolytic plating film is an electrolytic copper plating film. Metal foils respectively have mat surfaces between the core layer 20 and the conductor layers (34F, 34S). Via the mat surfaces, the core layer 20 and the conductor layers (34F, 34S) are bonded to each other. Further, metal foils respectively have mat surfaces between the resin insulating layers (50F, 150F, 250F, 50S, 150S, 250S) and the conductor layers (58F, 158F, 258F, 58S, 158S, 258S). Via the mat surfaces, the resin insulating layers (50F, 150F, 250F, 50S, 150S, 250S) and the conductor layers (58F, 158F, 258F, 58S, 158S, 258S) are bonded to each other.

FIG. 2A is an enlarged view of the printed wiring board illustrated in FIG. 1A, and illustrates a portion of the printed wiring board of FIG. 1A.

The first conductor layer (34F) is formed by a first metal foil (tf) formed on the first surface (F) of the core layer 20, a first seed layer (42tf) formed on the first metal foil (tf), and a first electrolytic plating film (44tf) formed on the first seed layer (42tf). The first metal foil (tf) has a first mat surface (32tfm) at an interface between the first surface (F) of the core layer 20 and the first metal foil (tf). A ten-point average roughness (Rz1) of an unevenness of the first mat surface (32tfm) is 3.0 µm or more and 5.0 µm or less.

The second conductor layer (34S) is formed by a second metal foil (ts) formed on the second surface (S) of the core layer 20, a second seed layer (42ts) formed on the second metal foil (ts), and a second electrolytic plating film (44ts) formed on the second seed layer (42ts). The second metal foil (ts) has a second mat surface (32tsm) at an interface between the second surface (S) of the core layer 20 and the second metal foil (ts). A ten-point average roughness (Rz2) of an unevenness of the second mat surface (32tsm) is 3.0 µm or more and 5.0 µm or less.

The inner side first conductor layer (58F) is formed by an inner side first metal foil (32sf) formed on the first resin insulating layer (50F), an inner side first seed layer (42sf) formed on the inner side first metal foil (32sf), and an inner side first electrolytic plating film (44sf) formed on the inner side first seed layer (42sf). The inner side first metal foil (32sf) has an inner side first mat surface (32sfm) at an interface between the first resin insulating layer (50F) and the inner side first metal foil (32sf). For example, a ten-point average roughness (RzI1) of an unevenness of the inner side first mat surface (32sfm) is 1.5 µm or more and 2.5 µm or less.

The inner side second conductor layer (58S) is formed by an inner side second metal foil (32ss) formed on the second resin insulating layer (50S), an inner side second seed layer (42ss) formed on the inner side second metal foil (32ss), and an inner side second electrolytic plating film (44ss) formed on the inner side second seed layer (42ss). The inner side second metal foil (32ss) has an inner side second mat surface (32ssm) at an interface between the second resin insulating layer (50S) and the inner side second metal foil (32ss). For example, a ten-point average roughness (RzI2) of an unevenness of the inner side second mat surface (32ssm) is 1.5 µm or more and 2.5 µm or less.

The inner side third conductor layer (158F) is formed by an inner side third metal foil (32gf) formed on the third resin insulating layer (150F), an inner side third seed layer (42gf)

formed on the inner side third metal foil (32*gf*), and an inner side third electrolytic plating film (44*gf*) formed on the inner side third seed layer (42*gf*). The inner side third metal foil (32*gf*) has an inner side third mat surface (32*gfm*) at an interface between the third resin insulating layer (150F) and the inner side third metal foil (32*gf*). For example, a ten-point average roughness (RzUI1) of an unevenness of the inner side third mat surface (32*gfm*) is 3.0 μm or more and 5.0 μm or less.

The inner side fourth conductor layer (158S) is formed by an inner side fourth metal foil (32*gs*) formed on the fourth resin insulating layer (150S), an inner side fourth seed layer (42*gs*) formed on the inner side fourth metal foil (32*gs*), and an inner side fourth electrolytic plating film (44*gs*) formed on the inner side fourth seed layer (42*gs*). The inner side fourth metal foil (32*gs*) has an inner side fourth mat surface (32*gsm*) at an interface between the fourth resin insulating layer (150S) and the inner side fourth metal foil (32*gs*). For example, a ten-point average roughness (RzUI2) of an unevenness of the inner side fourth mat surface (32*gsm*) is 3.0 μm or more and 5.0 μm or less.

The outermost first conductor layer (258F) is formed by an outermost first metal foil (32*uf*) formed on the outermost first resin insulating layer (250F), an outermost first seed layer (42*uf*) formed on the outermost first metal foil (32*uf*), and an outermost first electrolytic plating film (44*uf*) formed on the outermost first seed layer (42*uf*). The outermost first metal foil (32*uf*) has an outermost first mat surface (32*ufm*) at an interface between the outermost first resin insulating layer (250F) and the outermost first metal foil (32*uf*). For example, a ten-point average roughness (RzO1) of an unevenness of the outermost first mat surface (32*ufm*) is 3.0 μm or more and 5.0 μm or less.

The outermost second conductor layer (258S) is formed by an outermost second metal foil (32*us*) formed on the outermost second resin insulating layer (250S), an outermost second seed layer (42*us*) formed on the outermost second metal foil (32*us*), and an outermost second electrolytic plating film (44*us*) formed on the outermost second seed layer (42*us*). The outermost second metal foil (32*us*) has an outermost second mat surface (32*usm*) at an interface between the outermost second resin insulating layer (250S) and the outermost second metal foil (32*us*). For example, a ten-point average roughness (RzO2) of an unevenness of the outermost second mat surface (32*usm*) is 3.0 m or more and 5.0 μm or less.

In this specification, a ten-point average roughness can be referred to as a roughness.

The roughness (Rz1) of the unevenness of the first mat surface (32*tfm*), the roughness (Rz2) of the unevenness of the second mat surface (32*tsm*), the roughness (RzO1) of the unevenness of the outermost first mat surface (32*ufm*) and the roughness (RzO2) of the unevenness of the outermost second mat surface (32*usm*) are substantially equal to each other. Or, the roughness (Rz1) and the roughness (Rz2) are larger than the roughness (RzO1). The roughness (Rz1) and the roughness (Rz2) are larger than the roughness (RzO2). And, at least one of the roughness (RzI1) of the unevenness of the inner side first mat surface (32*sfm*) and the roughness (RzUI1) of the unevenness of the inner side third mat surface (32*gfm*) is smaller than the roughness (RzO1) of the unevenness of the outermost first mat surface (32*ufm*). It is also possible that both the roughness (RzI1) and the roughness (RzUI1) are smaller than the roughness (RzO1). In this case, the roughness (RzI1) and the roughness (RzUI1) are substantially equal to each other.

It is also possible that the roughness (RzI1) is smaller than the roughness (RzUI1) and the roughness (RzO1). In this case, the roughness (RzUI1) and the roughness (RzO1) are substantially equal to each other.

It is also possible that the roughness (RzUI1) is smaller than the roughness (RzI1) and the roughness (RzO1). In this case, the roughness (RzI1) and the roughness (RzO1) are substantially equal to each other.

The roughness (Rz1) of the unevenness of the first mat surface (32*tfm*), the roughness (Rz2) of the unevenness of the second mat surface (32*tsm*), the roughness (RzO1) of the unevenness of the outermost first mat surface (32*ufm*) and the roughness (RzO2) of the unevenness of the outermost second mat surface (32*usm*) are substantially equal to each other. Or, the roughness (Rz1) and the roughness (Rz2) are larger than the roughness (RzO1). The roughness (Rz1) and the roughness (Rz2) are larger than the roughness (RzO2). And, at least one of the roughness (RzI2) of the unevenness of the inner side second mat surface (32*ssm*) and the roughness (RzUI2) of the unevenness of the inner side fourth mat surface (32*gsm*) is smaller than the roughness (RzO1) of the unevenness of the outermost first mat surface (32*ufm*).

It is also possible that both the roughness (RzI2) and the roughness (RzUI2) are smaller than the roughness (RzO1). In this case, the roughness (RzI2) and the roughness (RzUI2) are substantially equal to each other.

It is also possible that the roughness (RzI2) is smaller than the roughness (RzUI2) and the roughness (RzO1). In this case, the roughness (RzUI2) and the roughness (RzO1) are substantially equal to each other.

It is also possible that the roughness (RzUI2) is smaller than the roughness (RzI2) and the roughness (RzO1). In this case, the roughness (RzI2) and the roughness (RzO1) are substantially equal to each other.

Rz1/RzO1, Rz1/RzO2, Rz2/RzO1 and Rz2/RzO2 are 0.9 or more and 1.1 or less.

In FIG. 1A, there are two inner side conductor layers (the inner side first conductor layer (58F) and the inner side third conductor layer (158F)) in the first build-up layer (Bu1). In this way, the first build-up layer (Bu1) has multiple inner side conductor layers. The inner side conductor layers each have a metal foil. And, a metal foil forming an inner side conductor layer has a mat surface having a large roughness or a mat surface having a small roughness. A roughness of a mat surface having a large roughness is larger than a roughness of a mat surface having a small roughness. Further, when the number of inner side conductor layers each formed by a metal foil having a mat surface having a large roughness is 2 or more, the roughnesses of the mat surfaces of the metal foils forming the conductor layers are substantially equal to each other. When the number of inner side conductor layers each formed by a metal foil having a mat surface having a small roughness is 2 or more, the roughnesses of the mat surfaces of the metal foils forming the conductor layers are substantially equal to each other. When the number of the inner side conductor layers is 2 or more, at least one inner side conductor layer is formed by a metal foil having a mat surface having a large roughness, and at least one inner side conductor layer is formed by a metal foil having a mat surface having a small roughness. The roughness of a metal foil having a mat surface having a large roughness is substantially equal to the roughness of the mat surface of the outermost first metal foil.

When the number of the inner side conductor layers is 3 or more, ⅔ or more of the inner side conductor layers are each formed by a metal foil having a mat surface having a small roughness.

In FIG. 1A, there are two inner side conductor layers (the inner side second conductor layer (58S) and the inner side fourth conductor layer (158S)) in the second build-up layer (Bu2). In this way, the second build-up layer (Bu2) has multiple inner side conductor layers. The inner side conductor layers each have a metal foil. And, a metal foil forming an inner side conductor layer has a mat surface having a large roughness or a mat surface having a small roughness. A roughness of a mat surface having a large roughness is larger than a roughness of a mat surface having a small roughness. Further, when the number of inner side conductor layers each formed by a metal foil having a mat surface having a large roughness is 2 or more, the roughnesses of the mat surfaces of the metal foils forming the conductor layers are substantially equal to each other. When the number of inner side conductor layers each formed by a metal foil having a mat surface having a small roughness is 2 or more, the roughnesses of the mat surfaces of the metal foils forming the conductor layers are substantially equal to each other. When the number of the inner side conductor layers is 2 or more, at least one inner side conductor layer is formed by a metal foil having a mat surface having a large roughness, and at least one inner side conductor layer is formed by a metal foil having a mat surface having a small roughness. The roughness of a metal foil having a mat surface having a large roughness is substantially equal to the roughness of the mat surface of the outermost first metal foil.

When the number of the inner side conductor layers is 3 or more, ⅔ or more of the inner side conductor layers are each formed by a metal foil having a mat surface having a small roughness.

Among the conductor layers formed in the first build-up layer (Bu1), the conductor layers other than the outermost conductor layer are the inner side conductor layers. Similarly, among the conductor layers formed in the second build-up layer (Bu2), the conductor layers other than the outermost conductor layer are the inner side conductor layers.

For example, the size of roughness of a mat surface having a small roughness is 1.5 μm or more and 2.5 μm or less. The size of roughness of a mat surface having a large roughness is 3.0 μm or more and 5.0 μm or less. The size of roughness of a mat surface having a large roughness is preferably 3.5 μm or more.

In the printed wiring board of the embodiment, the through-hole structures have the through-hole conductors 36 each having a neck part (28C), and the first through-hole lands (36F) respectively directly connected to the through-hole conductors 36. The first through-hole lands (36F) have the first metal foil (tf). Via the unevenness of the first mat surface (32*tfm*) of the first metal foil (tf), the first through-hole lands (36F) are bonded to the core layer 20. Further, the printed wiring board of the embodiment has first via structures (60Ft) respectively formed directly on the through-hole structures. The first via structures (60Ft) are formed by the first via conductors (60F), and first via lands (60FR) of first via conductors respectively directly connected to the first via conductors (60F). The first via lands (60FR) have the inner side first metal foil (32*sf*). And, via the unevenness of the inner side first mat surface (32*sfm*) of the inner side first metal foil (32*sf*), the first via lands (60FR) are bonded to the first resin insulating layer (50F).

The size (depth) of the unevenness of the first mat surface (32*tfm*) of the first metal foil (tf) is larger than the size (depth) of the unevenness of the inner side first mat surface (32*sfm*) of the inner side first metal foil (32*sf*). The inner side first mat surface (32*sfm*) is a mat surface having a small roughness, and the first mat surface (32*tfm*) is a mat surface having a large roughness. Therefore, for example, an adhesion strength between the first through-hole lands (36F) and the core layer 20 is higher than an adhesion strength between the first via lands (60FR) and the first resin insulating layer 50. When the printed wiring board of the embodiment is manufactured, the first resin insulating layer (50F) and the second resin insulating layer (50S) are laminated on the core substrate 30 having the through-hole conductors 36. During the manufacturing, an external force such as a pressure acts on the printed wiring board. The mat surfaces (32*sfm*, 32*ssm*) of the metal foils (32*sf*, 32*ss*) are respectively formed in the resin insulating layers (50F, 50S). The mat surfaces (32*sfm*, 32*ssm*) are respectively pressed into the resin insulating layers (50F, 50S). Therefore, the printed wiring board is thought to have a residual stress inside the printed wiring board. For example, it is expected that the larger are the depths (sizes) of the unevennesses of the mat surfaces of the metal foils, the larger is the stress accumulated in the printed wiring board. Further, when the via conductors (60F, 60S) are respectively formed directly on the through-hole structures, a stress inside the printed wiring board is presumably transmitted to the through-hole structures via the via conductors (60F, 60S). Due to the stress transmitted to the through-hole structures via the via conductors (60F, 60S), the through-hole conductors presumably peel off from the core layer. Reliability of the through-hole conductors 36 from the neck parts (28C) presumably decreases.

However, in the printed wiring board of the embodiment, since the unevenness of the mat surface (32*sfm*) of the first via lands (60FR) is small, it is thought that the residual stress can be reduced. For example, in the printed wiring board of the embodiment, the depth (size) of the unevenness of the inner side first mat surface (32*sfm*) of the inner side first metal foil (32*sf*) forming the via lands (60FR) of the first via structures (60Ft) respectively positioned directly above the through-hole structures is smaller than the depth (size) of the unevenness of the first mat surface (32*tfm*) of the first metal foil (tf) forming the first through-hole lands (36F) of the through-hole structures. When the depth (size) of the unevenness of the mat surface of the metal foil forming the via lands is small, the magnitude of the stress transmitted to the through-hole structures is thought to be reduced. Then, since the depth (size) of the unevenness of the first mat surface (32*tfm*) of the first metal foil (tf) forming the first through-hole lands (36F) is large, even when the stress is transmitted to the through-hole conductors 36 via the first via structures (60Ft), the through-hole conductors 36 are thought to be unlikely to peel off from the core layer 20. Therefore, a defect such as reduction in connection reliability or peeling of a conductor layer is unlikely to occur.

In the embodiment, the size (depth) of the unevenness of the first mat surface (32*tfm*) of the first metal foil (tf) is larger than the size (depth) of the unevenness of the inner side first mat surface (32*sfm*) of the inner side first metal foil (32*sf*). Therefore, even when a stress that occurs due to that the inner side first mat surface (32*sfm*) of the inner side first metal foil (32*sf*) forming the first via lands (60FR) is formed in the first resin insulating layer (50F) is transmitted to the interface between the first metal foil (tf) forming the first through-hole lands (36F) and the core layer 20, the stress is thought to be smaller than the bonding strength between the first through-hole lands (36F) and the core layer 20. Therefore, it is thought that through-hole structures will not peel off from the core layer.

The through-hole conductors 36 of the embodiment each have the neck part (28C). Further, the through-hole conductors 36 are positioned substantially at a center in a thickness direction of the printed wiring board. Therefore, a stress is thought to concentrate on the through-hole conductors. And, the stress is thought to be released in a form of heat or the like. Due to the concentration of the stress and the release of the stress, it is expected that the through-hole conductors 36 are likely to peel off from the core layer. Presumably, the reliability of the through-hole conductors from the neck parts (28C) is likely to decrease. However, the through-hole lands (36F, 36S) respectively directly connected to the through-hole conductors 36 are bonded to the core layer 20 via the mat surfaces (32*tfm*, 32*tsm*) each having a relatively large unevenness. Therefore, the through-hole conductors of the embodiment are unlikely to peel off from the core layer 20. Further, the connection reliability via the through-hole conductors is unlikely to decrease.

When the unevenness (roughness) of the inner side first mat surface (32*sfm*) of the inner side first metal foil (32*sf*) forming the first via lands (60FR) of the first via structures (60Ft) is small (shallow), even when the stress released from the through-hole structures is transmitted to the first via lands (60FR) of the first via structures (60Ft), the stress is unlikely to reach a deep portion of the first resin insulating layer (50F). Therefore, a crack is unlikely to occur in the first resin insulating layer (50F). For example, when the roughness of the inner side first mat surface (32*sfm*) of the inner side first metal foil (32*sf*) forming the first via lands (60FR) is smaller than the roughness of the first mat surface (32*tfm*) of the first metal foil (tf) forming the through-hole lands (36F), occurrence of a crack can be effectively prevented. When the roughness of the mat surface of the metal foil forming the via lands included in an inner side conductor layer is smaller than the roughness of the mat surface of the metal foil forming the through-hole lands, the same effect can be expected. Further, when the roughness of the mat surface of the metal foil forming the via lands included in an inner side conductor layer is smaller than the roughness of the mat surface of the metal foil forming an outermost conductor layer, the same effect can be expected.

The core substrate 30 is positioned at a center in the thickness direction of the printed wiring board. Therefore, a stress is thought to concentrate on the core substrate. When the size of the unevenness of the inner side first met surface (32*sfm*) of the inner side first metal foil (32*sf*) forming the first via lands (60FR) is larger than the size of the unevenness of the first mat surface (32*tfm*) of the first metal foil (tf) forming the first through-hole lands (36F), the magnitude of the stress that occurs due to that the inner side first mat surface of the inner side first metal foil (32*sf*) forming the first via lands (60FR) is formed in the first resin insulating layer (50F) is expected to exceed the adhesion strength between the first through-hole lands and the core layer. In this case, the through-hole lands are expected to peel off from the core layer.

When a residual stress is released, for example, the stress is transmitted to the outermost conductor layers (258F, 258S) via the through-hole conductors and the via conductors. Due to the stress, it is thought that peeling occurs between the outermost conductor layers (258F, 258S and the outermost resin insulating layers (250F, 250S). However, in the printed wiring board of the embodiment, the size of the unevenness of the outermost first mat surface (32*ufm*) of the outermost first metal foil (32*uf*) forming the outermost first conductor layer (258F) is larger than the size of the unevenness of the inner side first mat surface (32*sfm*) of the inner side first metal foil (32*sf*) forming the inner side first conductor layer (58F). Therefore, peeling is unlikely to occur between the outermost first conductor layer and the outermost first resin insulating layer. When the size of the unevenness of the mat surface of a metal foil forming at least one inner side conductor layer in the first build-up layer (Bu1) is smaller than the size of the unevenness of the mat surface of the metal foil forming the outermost first conductor layer, it is thought that the same effect can be obtained. Similarly, when the size of the unevenness of the mat surface of a metal foil forming at least one inner side conductor layer in the second build-up layer (Bu2) is smaller than the size of the unevenness of the mat surface of the metal foil forming the outermost second conductor layer, it is thought that the same effect can be obtained.

The roughness (Rz1) of the first mat surface (32*tfm*) of the first metal foil (tf) forming the first conductor layer (34F) and the roughness (RzO1) of the outermost first mat surface (32*ufm*) of the outermost first metal foil (32*uf*) forming the outermost first conductor layer (258F) are substantially equal to each other. For example, a ratio (R1) (Rz1/RzO1) is 0.9 or more and 1.1 or less. In this case, a crack is unlikely to occur from the outermost first mat surface (32*ufm*) of the outermost first metal foil (32*uf*) forming the outermost first conductor layer (258F) to the outermost first resin insulating layer (250F).

The roughness (Rz2) of the second mat surface (32*tsm*) of the second metal foil (ts) forming the second conductor layer (34S) and the roughness (RzO2) of the outermost second mat surface (32*usm*) of the outermost second metal foil (32*us*) forming the outermost second conductor layer (258S) are substantially equal to each other. For example, a ratio (R2) (Rz2/RzO2) is 0.9 or more and 1.1 or less. In this case, a crack is unlikely to occur from the outermost second mat surface (32*usm*) of the outermost second metal foil (32*us*) forming the outermost second conductor layer (258S) to the outermost second resin insulating layer (250S).

The first conductor layer (34F) has a thickness (Tf). The second conductor layer (34S) has a thickness (Ts). The inner side first conductor layer (58F) has a thickness (Sf). The inner side second conductor layer (58S) has a thickness (Ss). The inner side third conductor layer (158F) has a thickness (Gf). The inner side fourth conductor layer (158S) has a thickness (Gs). The outermost first conductor layer (258F) has a thickness (Uf). The outermost second conductor layer (258S) has a thickness (Us).

The thickness of a conductor layer is preferably related to the roughness of the mat surface. When the roughness (unevenness) of the mat surface is large, the thickness of the conductor layer is large. Conversely, when the roughness (unevenness) of the mat surface is small, the thickness of the conductor layer is small. The thickness of a conductor layer formed by a metal foil having a mat surface having a large roughness is larger than the thickness of a conductor layer formed by a metal foil having a mat surface having a small roughness. As a result, for example, high-speed transmission becomes possible. When the roughness of a mat surface is small, a resistance due to a skin effect is small. Therefore, even when the thickness of a conductor layer is small, high-speed transmission becomes possible. When the roughness of a mat surface is large, the resistance due to a skin effect is large. However, when the thickness of a conductor layer is large, a resistance of the conductor layer is small. Therefore, high-speed transmission becomes possible. A difference between a speed of data transmitted by a conductor layer having a large thickness and a speed of data transmitted by a conductor layer having a small thickness can be reduced. When the printed wiring board has a conductor layer having a large thickness, a strength of the printed wiring board can be increased. Warpage of the printed wiring board can be reduced.

For example, the size of the roughness of the first mat surface (32tfm), the size of the roughness of the second mat surface (32tsm), the size of the roughness of the outermost first mat surface (32 um) and the size of the roughness of the outermost second mat surface (32usm) are substantially equal to each other. Then, when the size of the roughness of the inner side first mat surface (32sfm) is smaller than the size of the roughness of the first mat surface (32tfm), the thickness (Sf) is smaller than the thickness (Tf). The thickness (Tf), the thickness (Ts), the thickness (Uf) and the thickness (Us) are substantially equal to each other. Further, when the size of the roughness of the inner side second mat surface (32ssm) is smaller than the size of the roughness of the first mat surface (32tfm), the thickness (Ss) is smaller than the thickness (Tf). Then, for example, the size of the roughness of the inner side first mat surface (32sfm) and the size of the roughness of the inner side second mat surface (32ssm) are substantially equal to each other. the thickness (Sf) and the thickness (Ss) are substantially equal to each other. Further, when the size of the roughness of the inner side third mat surface (32gfm) and the size of the roughness of the inner side first mat surface (32sfm) are substantially equal, the thickness (Gf) is smaller than the thickness (Tf). Then, the thickness (Gf) and the thickness (Sf) are substantially equal to each other. Further, when the size of the roughness of the inner side fourth mat surface (32gsm) and the size of the roughness of the inner side second mat surface (32ssm) are substantially equal to each other, the thickness (Gs) is smaller than the thickness (Tf). Then, the thickness (Gs) and the thickness (Ss) are substantially equal to each other.

When the size of roughness of the inner side third mat surface (32gfm) is larger than the size of the roughness of the inner side first mat surface (32sfm), the thickness (Gf) is larger than the thickness (Sf). Further, the thickness (Gf) and the thickness (Tf) are substantially equal to each other. In this case, the size of the roughness of the inner side third mat surface (32gfm) is substantially equal to the size of the roughness of the first mat surface (32tfm).

When the size of the roughness of the inner side fourth mat surface (32gsm) is larger than the size of the roughness of the inner side second mat surface (32ssm), the thickness (Gs) is larger than the thickness (Ss). Further, the thickness (Gs) and the thickness (Tf) are substantially equal to each other. In this case, the size of the roughness of the inner side fourth mat surface (32gsm) is substantially equal to the size of the roughness of the first mat surface (32tfm).

In this way, the thickness of a conductor layer having a mat surface having a relatively small roughness is smaller than the thickness of a conductor layer having a mat surface having a relatively large roughness. When the first build-up layer (Bu1) includes multiple inner side conductor layers, the first build-up layer (Bu1) is formed by one or more conductor layers each having a mat surface having a relatively small roughness and one or more conductor layers each having a mat surface having a relatively large roughness. Similarly, when the second build-up layer (Bu2 includes multiple inner side conductor layers, the second build-up layer (Bu2 is formed by one or more conductor layers each having a mat surface having a relatively small roughness and one or more conductor layers each having a mat surface having a relatively large roughness.

The thickness of a metal foil forming a conductor layer preferably relates to the size of the roughness of the mat surface. When the size of the roughness of the mat surface is large, the thickness of the metal foil is large. Conversely, when the size of the roughness of the mat surface is small, the thickness of the metal foil is small. The thickness of a metal foil having a mat surface having a large roughness is larger than the thickness of a metal foil having a mat surface having a small roughness. As a result, for example, high-speed transmission becomes possible. When the roughness of a mat surface is small, a resistance due to a skin effect is small. Therefore, even when the thickness of a metal foil is small, high-speed transmission becomes possible. When the roughness of a mat surface is large, the resistance due to a skin effect is large. However, since the thickness of the metal foil is large, high-speed transmission becomes possible. When the printed wiring board has a metal foil having a large thickness, the strength of the printed wiring board can be increased. Warpage of the printed wiring board can be reduced.

The thickness of a metal foil having a mat surface having a relatively small roughness is smaller than the thickness of a metal foil having a mat surface having a relatively large roughness. When the first build-up layer (Bu1) includes multiple inner side conductor layers, the first build-up layer (Bu1) is formed by one or more conductor layers each including a metal foil having a mat surface having a relatively small roughness and one or more conductor layers each including a metal foil having a mat surface having a relatively large roughness. Similarly, when the second build-up layer (Bu2) includes multiple inner side conductor layers, the second build-up layer (Bu2) is formed by one or more conductor layers each including a metal foil having a mat surface having a relatively small roughness and one or more conductor layers each including a metal foil having a mat surface having a relatively large roughness.

The thickness of an electrolytic plating film forming a conductor layer relates to the size of the roughness of the mat surface. When the size of the roughness of the mat surface is large, the thickness of the electrolytic plating film is small. Conversely, when the size of the roughness of the mat surface is small, the thickness of the electrolytic plating film is large. The thickness of an electrolytic plating film formed on a metal foil having a mat surface having a large roughness is smaller than the thickness of an electrolytic plating film formed on a metal foil having a mat surface having a small roughness.

A thickness of the first electrolytic plating film (44tf) forming the first conductor layer (34F) is a thickness (t1), and a thickness of the second electrolytic plating film (44ts) forming the second conductor layer (34S) is a thickness (t2). A thickness of the inner side first electrolytic plating film (44sf) forming the inner side first conductor layer (58F) is a thickness (s1), and a thickness of the inner side second electrolytic plating film (44ss) forming the inner side second conductor layer (58S) is a thickness (s2). A thickness of the inner side third electrolytic plating film (44gf) forming the inner side third conductor layer (158F) is a thickness (g1), and a thickness of the inner side fourth electrolytic plating film (44gs) forming the inner side fourth conductor layer (158S) is a thickness (g2). A thickness of the outermost first electrolytic plating film (44uf) forming the outermost first conductor layer (258F) is a thickness (u1), and a thickness of the outermost second electrolytic plating film (44*us*) forming the outermost second conductor layer (258S) is a thickness (u2).

For the conductor layers (34F, 34S) of the core substrate and the outermost conductor layers (258F, 258S), a ratio ((the thickness of the electrolytic plating film)/(the thickness of the metal foil)) is smaller than 1.

Among the inner side conductor layers formed in the first build-up layer (Bu1), for at least one inner side conductor layer, the ratio ((the thickness of the electrolytic plating film)/(the thickness of the metal foil)) is larger than 1. Among the inner side conductor layers formed in the first build-up layer (Bu1), for at least one inner side conductor layer, the ratio ((the thickness of the electrolytic plating film)/(the thickness of the metal foil)) is smaller than 1.

Among the inner side conductor layers formed in the second build-up layer (Bu2), for at least one inner side conductor layer, the ratio ((the thickness of the electrolytic plating film)/(the thickness of the metal foil)) is larger than 1. Among the inner side conductor layers formed in the second build-up layer (Bu2), for at least one inner side conductor layer, the ratio ((the thickness of the electrolytic plating film)/(the thickness of the metal foil)) is smaller than 1.

For example, a ratio (t1/T1) of the thickness (t1) of the first electrolytic plating film (44*tf*) to the thickness (T1) of the first metal foil (tf) is smaller than 1. A ratio (t2/T2) of the thickness (t2) of the second electrolytic plating film (44*ts*) to the thickness (T2) of the second metal foil (ts) is smaller than 1. A ratio (u1/U1) of the thickness (u1) of the outermost first electrolytic plating film (44*uf*) to the thickness (U1) of the outermost first metal foil (32*uf*) is smaller than 1. A ratio (u2/U2) of the thickness (u2) of the outermost second electrolytic plating film (44*us*) to the thickness (U2) of the outermost second metal foil (32*us*) is smaller than 1. A ratio (s1/S1) of the thickness (s1) of the inner side first electrolytic plating film (44*sf*) to the thickness (S1) of the inner side first metal foil (32*sf*) is larger than 1. A ratio (s2/S2) of the thickness (s2) of the inner side second electrolytic plating film (44*ss*) to the thickness (S2) of the inner side second metal foil (32*ss*) is larger than 1.

The printed wiring board 10 of the embodiment includes conductor layers each including a metal foil having a mat surface having a relatively small roughness, and conductor layers each including a metal foil having a mat surface having a relatively large roughness. Then, the conductor layers each include a metal foil on the core layer or on a resin insulating layer, and an electrolytic plating film on the metal foil. For a conductor layer including a metal foil having a mat surface having a relatively small roughness, a ratio ((the thickness of the electrolytic plating film)/(the thickness of the metal foil)) of the thickness of the electrolytic plating film to the thickness of the metal foil is larger than 1. Further, for a conductor layer including a metal foil having a mat surface having a relatively large roughness, the ratio ((the thickness of the electrolytic plating film)/(the thickness of the metal foil)) of the thickness of the electrolytic plating film to the thickness of the metal foil is smaller than 1.

For example, in the printed wiring board illustrated in FIG. 2A, the inner side first metal foil (32*sf*) and the inner side second metal foil (32*ss*) each have a mat surface having a relatively small roughness, and the other metal foils (tf, 32*ts*, 32*gf*, 32*gs*, 32*uf*, 32*us*) each have a mat surface having a relatively large roughness. In this case, the thickness (S1) of the inner side first metal foil (32*sf*) and the thickness (S2) of the inner side second metal foil (32*ss*) are substantially equal to each other. Further, the thickness (S1) and the thickness (S2) are smaller than the thicknesses (T1, T2, G1, G2, U1, U2) of the other metal foils (tf, 32*ts*, 32*gf*, 32*gs*, 32*uf*, 32*us*).

For example, in the printed wiring board illustrated in FIG. 2A, the inner side first metal foil (32*sf*), the inner side second metal foil (32*ss*), the inner side third metal foil (32*gf*) and the inner side fourth metal foil (32*gs*) each have a mat surface having a relatively small roughness, and the other metal foils (tf, 32*ts*, 32*uf*, 32*us*) each have a mat surface having a relatively large roughness. In this case, the thickness (S1), the thickness (S2), the thickness (G1) and the thickness (G2) are substantially equal to each other. Further, the thickness (S1), the thickness (S2), the thickness (G1) and the thickness (G2) are smaller than the thicknesses (T1, T2, U1, U2) of the other metal foils (tf, 32*ts*, 32*uf*, 32*us*).

In the printed wiring board of the embodiment, since the thickness (Uf) of the outermost first conductor layer (258F) and the thickness (Us) of the outermost second conductor layer (258S) are large, the thickness (U1) of the outermost first metal foil (32*uf*) forming the outermost first conductor layer (258F) and the thickness (U2) of the outermost second metal foil (32*us*) forming the outermost second conductor layer (258S) can be increased. As a result, the size of the roughness of the mat surface of the outermost first metal foil (32*uf*) and the size of the roughness of the mat surface of the outermost second metal foil (32*us*) can be increased. Therefore, the adhesion strength between the outermost first resin insulating layer (250F) and the outermost first metal foil (32*uf*) and the adhesion strength between the outermost second resin insulating layer (250S) and the outermost second metal foil (32*us*) can be increased. Therefore, mounting reliability of an electronic component mounted on the outermost first conductor layer (258F) or the outermost second conductor layer (258S) can be increased.

Further, the thickness of at least one inner side conductor layer in the first build-up layer (Bu1) is smaller than the thicknesses of the conductor layers of the core substrate and the thicknesses of the outermost conductor layers. Further, the thickness of at least one inner side conductor layer in the second build-up layer (Bu2) is smaller than the thicknesses of the conductor layers of the core substrate and the thicknesses of the outermost conductor layers. For example, the thickness of the inner side first conductor layer (58F), the thickness of the inner side second conductor layer (58S), the thickness of the inner side third conductor layer (158F) and the thickness of the inner side fourth conductor layer (158S) are smaller than the thicknesses of the conductor layers of the core substrate and the thicknesses of the outermost conductor layers. Therefore, fine wirings can be formed in the inner side first conductor layer (58F), the inner side second conductor layer (58S), the inner side third conductor layer (158F) and the inner side fourth conductor layer (158S). A printed wiring board having a high wiring density can be provided. A small printed wiring board can be provided.

The core substrate 30 is positioned at the center of the printed wiring board 10 in the thickness direction. Therefore, a large thermal stress is thought to act on the conductor layers forming the core substrate. Therefore, due to heat cycles, the first conductor layer (34F) or the second conductor layer (34S) is likely to peel off from the core layer. However, in the printed wiring board of the embodiment, the thickness (Tf) of the first conductor layer (34F) and the thickness (Ts) of the second conductor layer (34S) are large. Therefore, the thickness (T1) of the first metal foil (tf) forming the first conductor layer (34F) and the thickness (T2) of the second metal foil (ts) forming the second conductor layer (34S) can be increased. The roughness of the mat surface of the first metal foil (tf) and the roughness of the mat surface of the second metal foil (ts) can be increased. As a result, the adhesion strength between the core layer 20 and the first conductor layer (34F) can be increased. The adhesion strength between the core layer 20 and the second conductor layer (34S) can be increased. Even when the printed wiring board 10 is subjected to heat cycles, the first conductor layer (34F) and the second conductor layer (34S) are unlikely to peel off from the core layer.

The printed wiring board 10 of the embodiment has conductor layers each having a relatively large thickness and conductor layers each having a relatively small thickness. The conductor layers are classified into conductor layers each having a relatively large thickness and conductor layers each having a relatively small thickness. For example, the thicknesses of the conductor layers belonging to the conductor layers each having a relatively large thickness are substantially equal to each other. For example, the thicknesses of the conductor layers belonging to the conductor layers each having a relatively small thickness are substantially equal to each other.

The conductor layers of the printed wiring board 10 of the embodiment include conductor layers each having a first type metal foil and conductor layers each having a second type metal foil. A size of an unevenness forming a mat surface of a first type metal foil is larger than a size of an unevenness forming a mat surface of a second type metal foil. A first type metal foil has a mat surface having a relatively large roughness. A second type metal foil has a mat surface having a relatively small roughness. For example, in the printed wiring board 10 of the embodiment, a metal foil forming a conductor layer is classified as a first type metal foil or a second type metal foil. The printed wiring board 10 of the embodiment has conductor layers each including a metal foil having a mat surface having a relatively large roughness, and conductor layers each including a metal foil having a mat surface having a relatively small roughness. The thicknesses of the conductor layers each including a first type metal foil are substantially equal to each other. The thicknesses of the conductor layers each including a second type metal foil are substantially equal to each other. A size of an unevenness of a mat surface of a first type metal foil is 3.0 μm or more and 5.0 μm or less. A size of an unevenness of a mat surface of a second type metal foil is 1.0 μm or more and 2.5 μm or less.

For example, the first conductor layer (34F), the second conductor layer (34S), the outermost first conductor layer (258F) and the outermost second conductor layer (258S) belong to the conductor layers each having a relatively large thickness. At least one of the inner side conductor layers in the first build-up layer (Bu1) belongs to the conductor layers each having a relatively small thickness. Further, at least one of the inner side conductor layers in the second build-up layer (Bu2) belongs to the conductor layers each having a relatively small thickness. A ratio (RTT) of the thickness of a conductor layer having a relatively large thickness to the thickness of a conductor layer having a relatively small thickness is 1.2 or more and 3 or less. When the ratio (RTT) is less than 1.2, the adhesion strength cannot be significantly improved. When the ratio (RTT) exceeds 3, the change in the adhesion strength becomes small.

For example, in the printed wiring board 10 illustrated in FIG. 2A, the inner side first conductor layer (58F), the inner side second conductor layer (58S), the inner side third conductor layer (158F) and the inner side fourth conductor layer (158S) belong to the conductor layers each having a relatively small thickness. In this example, the ratio (RTT) is 1.2 or more and 1.8 or less.

In the embodiment, the thickness (Uf) of the outermost first conductor layer (258F) and the thickness (Us) of the outermost second conductor layer (258S) are large. Therefore, the printed wiring board 10 is reinforced by these outermost conductor layers. The printed wiring board is reinforced by the conductor layers positioned outermost. Therefore, warpage of the printed wiring board can be reduced. Connection reliability between the first conductor layer (34F) and the second conductor layer (34S) via the through-hole conductors 36 can be increased.

Since the thickness (Tf) of the first conductor layer (34F) and the thickness (Ts) of the second conductor layer (34S) are large, the strength of the core substrate 30 can be increased. Therefore, a stress acting on the through-hole conductors 36 can be reduced. Connection reliability between the first conductor layer (34F) and the second conductor layer (34S) via the through-hole conductors 36 can be increased.

For example, the thickness (Sf) of the inner side first conductor layer (58F), the thickness (Ss) of the inner side second conductor layer (58S), the thickness (Gf) of the inner side third conductor layer (158F), and the thickness (Gs) of the inner side fourth conductor layer (158S) are small. Or, for example, the thickness (Sf) of the inner side first conductor layer (58F) and the thickness (Ss) of the inner side second conductor layer (58S) are relatively small, and the thickness (Gf) of the inner side third conductor layer (158F) and the thickness (Gs) of the inner side fourth conductor layer (158S) are relatively large. Or, for example, the thickness (Sf) of the inner side first conductor layer (58F) and the thickness (Ss) of the inner side second conductor layer (58S) are relatively large, and the thickness (Gf) of the inner side third conductor layer (158F) and the thickness (Gs) of the inner side fourth conductor layer (158S) are relatively small. When the inner side conductor layers include conductor layers each having a relatively small thickness, fine conductor circuits can be formed in the inner side conductor layers. The number of the conductor layers and the number of the resin insulating layers can be reduced. The number of the via conductors laminated directly on the through-hole conductors 36 can be reduced. Therefore, a stress acting on the through-hole conductors 36 can be reduced. Connection reliability between the first conductor layer (34F) and the second conductor layer (34S) via the through-hole conductors 36 can be increased.

For a conductor layer having a relatively large thickness, the thickness of the metal foil forming the conductor layer is larger than the thickness of the electrolytic plating film forming the conductor layer. For a conductor layer including a metal foil having a mat surface having a relatively large roughness, the thickness of the metal foil forming the conductor layer is larger than the thickness of the electrolytic plating film forming the conductor layer.

For example, for each of the first conductor layer (34F), the second conductor layer (34S), the outermost first conductor layer (258F) and the outermost second conductor layer (258S), the thickness of the metal foil forming the conductor layer is larger than the thickness of the electrolytic plating film forming the conductor layer. Therefore, variation in the thickness of each of these conductor layers can be reduced. The thickness of each of these conductor layers can be made uniform. This is because variation in the thickness of the metal foil is smaller than variation in the thickness of the electrolytic plating film. Since variation in the thickness of each of the outermost conductor layers is small, for example, flatness of a surface on which an electronic component is mounted or flatness of a surface for connecting to another circuit substrate can be increased. Therefore, connection reliability between the printed wiring board of the embodiment and the electronic component or connection reliability between the printed wiring board of the embodiment and the other circuit substrate can be increased.

Since the variation in the thickness of the first conductor layer forming the core substrate and the variation in the thickness of the second conductor layer forming the core substrate 30 can be reduced, for example, the flatness of the core substrate can be increased. In the printed wiring board of the embodiment, the build-up layers are laminated on the core substrate. Therefore, by increasing the flatness of the core substrate, for example, the flatness of a surface on which an electronic component is mounted or the flatness of a surface for connecting to another circuit substrate can be increased.

The via conductors are formed by filling openings for the via conductors with an electrolytic plating film. Therefore, when the thickness of the electrolytic plating film is larger than the thickness of the metal foil, the openings for the via conductors can be easily filled with the electrolytic plating film. When a thickness of an electrolytic plating film forming via lands is larger than a thickness of a metal foil forming the via lands, upper surfaces of the via lands are likely to be flat. Therefore, other via conductors can be laminated directly on the via lands. Among the inner side conductor layers in the first build-up layer (Bu1), for ⅔ or more of the inner side conductor layers, the thickness of the electrolytic plating film is larger than the thickness of the metal foil. Similarly, among the inner side conductor layers in the second build-up layer (Bu2), for ⅔ or more of the inner side conductor layers, the thickness of the electrolytic plating film is larger than the thickness of the metal foil.

For example, in the printed wiring board 10 of the embodiment, for the inner side first conductor layer (58F), the inner side second conductor layer (58S), the inner side third conductor layer (158F) and the inner side fourth conductor layer (158S), the thickness of the electrolytic plating film is larger than the thickness of the metal foil. In this example, for all of the inner side conductor layers, the thickness of the electrolytic plating film is larger than the thickness of the metal foil. Therefore, the flatness of the upper surfaces of the first via lands on the first via conductors (60F), the second via lands on the second via conductors (60S), the third via lands on the third via conductors (160F) and the fourth via lands on the fourth via conductors (160S) can be increased. This is because the first via conductors (60F), the second via conductors (60S), the third via conductors (160F) and the fourth via conductors (160S) are mainly formed by the electrolytic plating films. When the thicknesses of the electrolytic plating films are small, the openings of the via conductors are difficult to be filled. However, in the embodiment, since the thicknesses of the electrolytic plating films are large, the openings of the via conductors can be filled. When the upper surfaces of the via lands on the via conductors are flat, via conductors can be formed directly on via conductors. A high density printed wiring board can be provided. Further, the number of the resin insulating layers and the number of the conductor layers can be reduced. Therefore, warpage of the printed wiring board can be reduced. A stress acting on the through-hole conductors of the core substrate can be reduced.

For example, the inner side first metal foil (32*sf*), the inner side second metal foil (32*ss*), the inner side third metal foil (32*gf*) and the inner side fourth metal foil (32*gs*) each have a mat surface having a relatively small rough surface.

Or, for example, the inner side first metal foil (32*sf*) and the inner side second metal foil (32*ss*) each have a mat surface having a relatively small rough surface, and the inner side third metal foil (32*gf*) and the inner side fourth metal foil (32*gs*) each have a mat surface having a relatively large rough surface.

Or, for example, the inner side first metal foil (32*sf*) and the inner side second metal foil (32*ss*) each have a mat surface having a relatively large rough surface, and the inner side third metal foil (32*gf*) and the inner side fourth metal foil (32*gs*) each have a mat surface having a relatively small rough surface.

Manufacturing Method of Embodiment

A method for manufacturing the printed wiring board 10 of the embodiment is illustrated in FIG. 3A-7B.

Figure 3A:
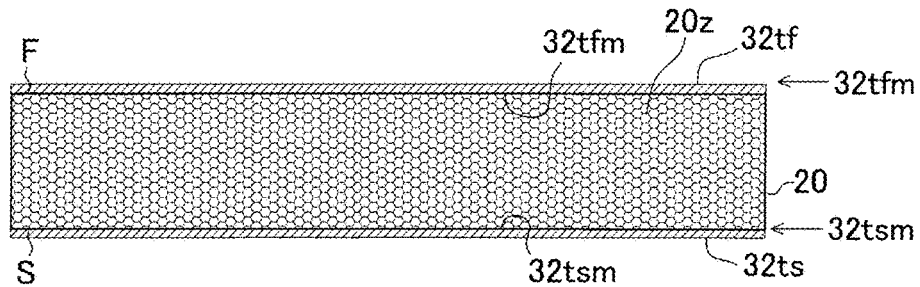
FIG. 3A-3D are manufacturing process diagrams of the printed wiring board of the embodiment.

A starting substrate (20*z*) illustrated in FIG. 3A is prepared. The starting substrate (20*z*) is formed by the core layer 20 having the first surface (F) and the second surface (S) on an opposite side with respect to the first surface (F), the first metal foil (tf) laminated on the first surface (F) of the core layer 20, and the second metal foil (ts) laminated on the second surface (S) of the core layer 20. The first metal foil (tf) has a first mat surface (32*tfm*) at an interface between the first surface (F) of the core layer 20 and the first metal foil (tf). The roughness (Rz1) of the first mat surface (32*tfm*) is 3.5 µm or more and 5.0 µm or less. The second metal foil (ts) has a second mat surface (32*tsm*) at an interface between the second surface (S) of the core layer 20 and the second metal foil (ts). The roughness (Rz2) of the second mat surface (32*tsm*) is 3.5 µm or more and 5.0 µm or less. The core layer 20 is formed of a resin and a reinforcing material. The core layer 20 may have inorganic particles. Examples of the resin of the core layer 20 include an epoxy resin and a BT (bismaleimide triazine) resin. Examples of the reinforcing material of the core layer 20 include a glass cloth and an aramid fiber. Examples of the inorganic particles of the core layer 20 include silica particles and alumina particles.

Figure 3B:
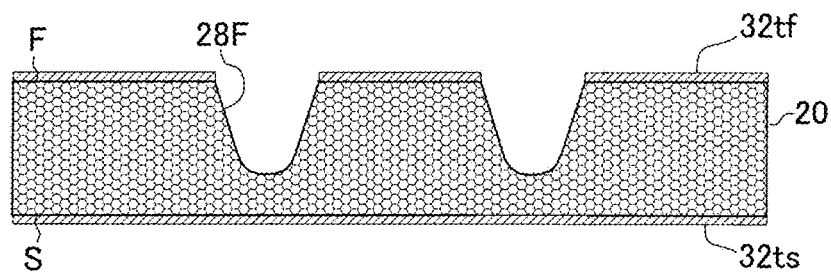

As illustrated in FIG. 3B, CO2 laser is irradiated to the first metal foil (tf). The first openings (28F) are formed on the first surface (F) side of the insulating substrate. The first openings (28F) are each tapered from the first surface (F) toward the second surface (S). Conditions of the laser are set such that the tapered shapes are formed. The conditions of the laser include the number of shots, a pulse width, an output, and the like. A diameter of a second shot can be set to be smaller than a diameter of a first shot.

Figure 3C:
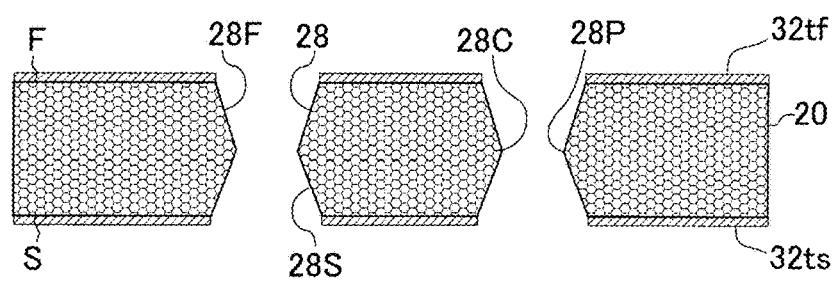

As illustrated in FIG. 3C, CO2 laser is irradiated to the second metal foil (ts). The second openings (28S) are formed on the second surface (S) side of the insulating substrate. The second openings (28S) are each tapered from the second surface (S) toward the first surface (F). Conditions of the laser are set such that the tapered shapes are formed. The conditions of the laser include the number of shots, a pulse width, an output, and the like. A diameter of a second shot can be set to be smaller than a diameter of a first shot. The through holes 28 are formed by the first openings (28F) and the second openings (28S). A joining area (28P) is formed at a joining place between a first opening (28F) and a second opening (28S). An outer periphery of the joining area (28P) forms a neck part (28C).

Figure 3D:
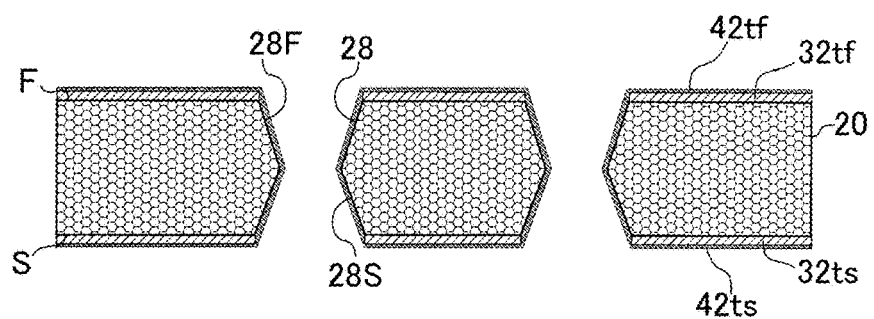
Figure 4A:
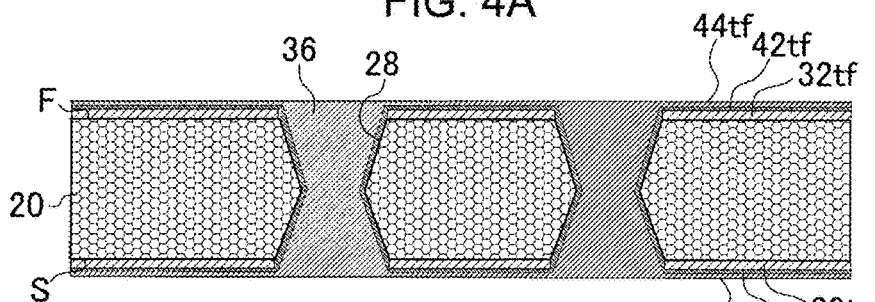
FIG. 4A-4D are manufacturing process diagrams of the printed wiring board of the embodiment.
Figure 4B:
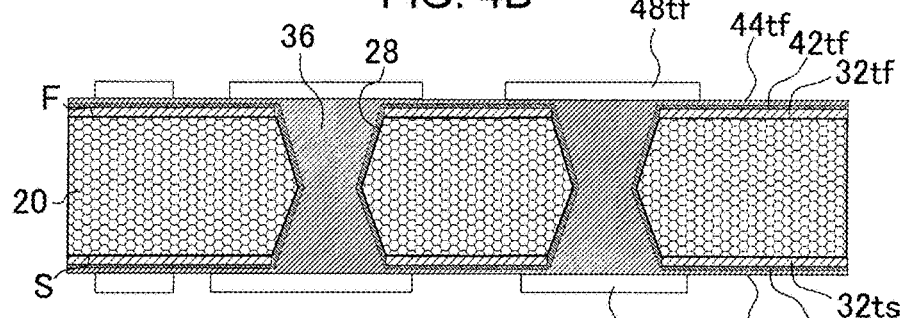
Figure 4C:
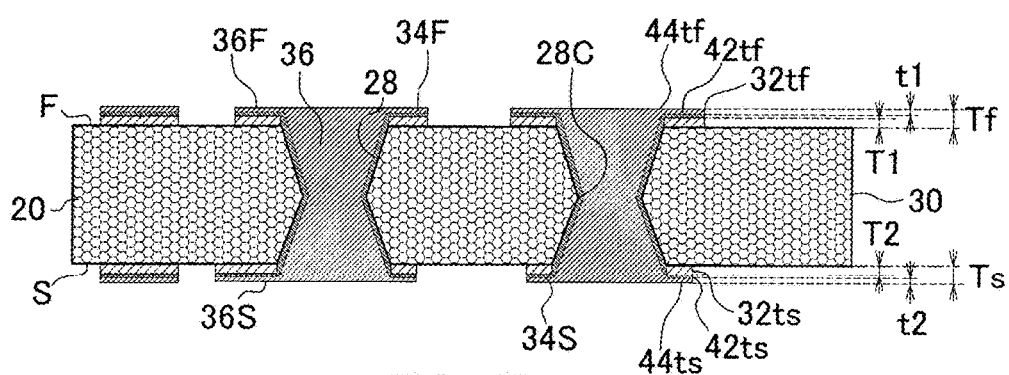

The first seed layer (42*tf*) and the second seed layer (42*ts*) are formed on the first metal foil (tf), the second metal foil (ts), and side walls of the through holes 28 by an electroless plating treatment (FIG. 3D). The first electrolytic plating film (44*tf*) is formed using the first seed layer (42*tf*), and the second electrolytic plating film (44ts) is formed using the second seed layer (42ts) (FIG. 4A). A first etching resist (48tf) is formed on the first electrolytic plating film (44tf). A second etching resist (48ts) is formed on the second electrolytic plating film (44ts) (FIG. 4B). The first electrolytic plating film (44tf), the first seed layer (42tf) and the first metal foil (tf) exposed from the first etching resist are removed by etching. The second electrolytic plating film (44ts), the second seed layer (42ts) and the second metal foil (ts) exposed from the second etching resist are removed by etching. The etching resists are removed, and the core substrate 30 is completed (FIG. 4C). The through-hole conductors 36 are respectively formed in the through holes 28. Simultaneously, the first conductor layer (34F) including the first through-hole lands (36F) and the second conductor layer (34S) including the second through-hole lands (36S) are formed. The first conductor layer (34F) and the second conductor layer (34S) are formed using a subtractive method.

In the embodiment, the joining area (28P) and the neck part (28C) are formed at a substantially central portion of each of the through holes 28. Therefore, when the through-hole conductors 36 are formed by plating, voids are unlikely to be generated in the through-hole conductors 36. Reliability of the through-hole conductors 36 is high. The first conductor layer (34F) includes the first metal foil (tf), the first seed layer (42tf) formed on the first metal foil (tf), and the first electrolytic plating film (44tf) formed on the first seed layer (42tf). The second conductor layer (34S) includes the second metal foil (ts), the second seed layer (42ts) on the second metal foil (ts), and the second electrolytic plating film (44ts) on the second seed layer (42ts). The thickness (Tf) of the first conductor layer (34F) is 15 μm or more and 35 μm or less, the thickness (Ts) of the second conductor layer (34S) is 15 μm or more and 35 μm or less, the thickness (T1) of the first metal foil (tf) is 2 μm or more and 15 μm or less, and the thickness (T2) of the second metal foil (ts) is 2 μm or more and 15 μm or less. The thickness (t1) of the first electrolytic plating film (44tf) is 1 μm or more and 12 μm or less, and the thickness (t2) of the second electrolytic plating film (44ts) is 1 μm or more and 12 μm or less.

Figure 4D:
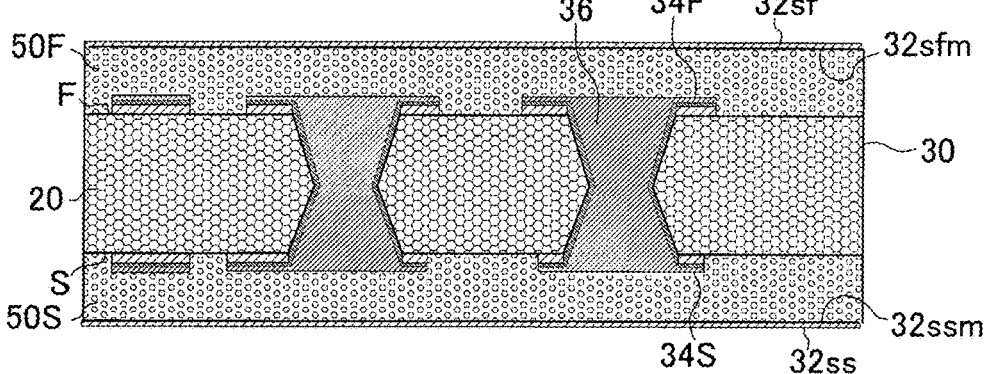

The first resin insulating layer (50F) and the inner side first metal foil (32sf) are sequentially laminated on the first surface (F) of the core substrate 30. The second resin insulating layer (50S) and the inner side second metal foil (32ss) are sequentially laminated on the second surface (S) (FIG. 4D). The inner side first metal foil (32sf) has an inner side first mat surface (32sfm) at an interface between the first resin insulating layer (50F) and the inner side first metal foil (32sf). The roughness (Rzl1) of the inner side first mat surface (32sfm) is 1.5 μm or more and 2.0 μm or less. The inner side second metal foil (32ss) has an inner side second mat surface (32ssm) at an interface between the second resin insulating layer (50S) and the inner side second metal foil (32ss). The roughness (Rzl2) of the inner side second mat surface (32ssm) is 1.5 μm or more and 2.0 μm or less. The first resin insulating layer (50F) and the second resin insulating layer (50S) are each formed of a reinforcing material such as a glass cloth, inorganic particles such as silica particles, and a resin such as an epoxy resin. Using $CO_2$ gas laser, openings (51F) penetrating the first resin insulating layer (50F) and the inner side first metal foil (32sf) and reaching the first conductor layer (34F) are formed, and openings (51S) penetrating the second resin insulating layer (50S) and the inner side second metal foil (32ss) and reaching the second conductor layer (34S) are formed (FIG. 5A).

The inner side first seed layer (42sf) is formed on the inner side first metal foil (32sf) and on inner walls of the openings (51F). The inner side second seed layer (42ss) is formed on the inner side second metal foil (32ss) and on inner walls of the openings (51S). A plating resist (48sf) is formed on the inner side first seed layer (42sf), and a plating resist (48ss) is formed on the inner side second seed layer (42ss) (FIG. 5B). The inner side first electrolytic plating film (44sf) is formed on the inner side first seed layer (42sf) exposed from the plating resist (48sf). The inner side second electrolytic plating film (44ss) is formed on the inner side second seed layer (42ss) exposed from the plating resist (48ss). In this case, the openings (51F) are filled with the inner side first electrolytic plating film (44sf). The openings (51S) are filled with the inner side second electrolytic plating film (44ss). The first via conductors (60F) connecting to the first conductor layer (34F) are respectively formed in the openings (51F). The second via conductors (60S) connecting to the second conductor layer (34S) are respectively formed in the openings (51S) (FIG. 5C). The plating resists (48sf, 48ss) are removed.

The inner side first seed layer (42sf) and the inner side first metal foil (32sf) exposed from the inner side first electrolytic plating film (44sf) are removed. The inner side second seed layer (42ss) and the inner side second metal foil (32ss) exposed from the inner side second electrolytic plating film (44ss) are removed. The inner side first conductor layer (58F) and the inner side second conductor layer (58S) are each formed by an MSAP (Modified Semi Additive Process) (FIG. 5D). The inner side first conductor layer (58F) includes the inner side first metal foil (32sf), the inner side first seed layer (42sf) on the inner side first metal foil (32sf), and the inner side first electrolytic plating film (44sf) on the inner side first seed layer (42sf). The inner side second conductor layer (58S) includes the inner side second metal foil (32ss), the inner side second seed layer (42ss) on the inner side second metal foil (32ss), and the inner side second electrolytic plating film (44ss) on the inner side second seed layer (42ss). The thickness (Sf) of the inner side first conductor layer (58F) is 5 μm or more and 25 μm or less, and the thickness (Ss) of the inner side second conductor layer (58S) is 5 μm or more and 25 m or less. The thickness (S1) of the inner side first metal foil (32sf) is 2 μm or more and 5 μm or less, and the thickness (s1) of the inner side first electrolytic plating film (44sf) is 5 μm or more and 25 μm or less. The thickness (S2) of the inner side second metal foil (32ss) is 2 μm or more and 5 μm or less, and the thickness (s2) of the inner side second electrolytic plating film (44ss) is 5 μm or more and 25 μm or less.

The processes of FIG. 4D-5D are repeated.

The third resin insulating layer (150F) is formed on the first resin insulating layer (50F) and the inner side first conductor layer (58F).

The fourth resin insulating layer (150S) is formed on the second resin insulating layer (50S) and the inner side second conductor layer (58S).

The inner side third conductor layer (158F) is formed on the third resin insulating layer (150F) by an MSAP. At the same time, the third via conductors (160F) are formed penetrating the third resin insulating layer (150F) and connecting the inner side first conductor layer (58F) and the inner side third conductor layer (158F) to each other. The inner side third conductor layer (158F) includes the inner side third metal foil (32gf), the inner side third seed layer (42gf) on the inner side third metal foil (32gf), and the inner side third electrolytic plating film (44gf) on the inner side third seed layer (42gf).

The inner side third metal foil (32gf) has an inner side third mat surface (32gfm) at an interface between the third resin insulating layer (150F) and the inner side third metal foil (32gf). The roughness (RzUI1) of the third mat surface (32gfm) is 1.5 µm or more and 2.0 µm or less.

The thickness (Gf) of the inner side third conductor layer (158F) is 5 µm or more and 25 µm or less. The thickness (G1) of the third metal foil (32gf) is 2 µm or more and m or less, the thickness (g1) of the inner side third electrolytic plating film (44gf) is 5 µm or more and 25 µm or less.

Figure 6A:
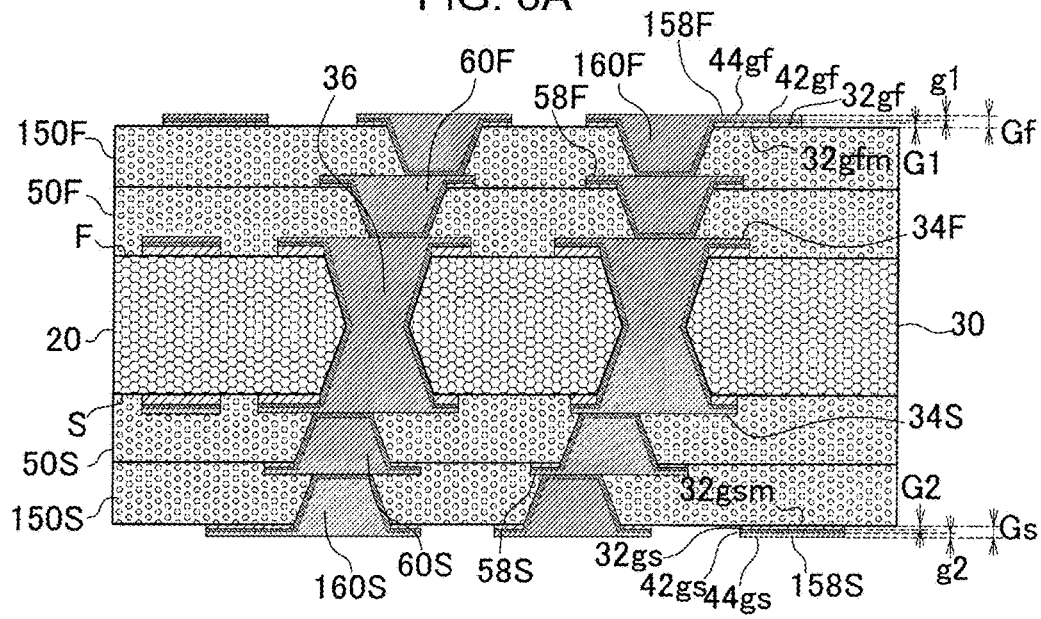
FIGS. 6A and 6B are manufacturing process diagrams of the printed wiring board of the embodiment.

The inner side fourth conductor layer (158S) is formed on the fourth resin insulating layer (150S) by an MSAP. At the same time, the fourth via conductors (160S) are formed penetrating the fourth resin insulating layer (150S) and connecting the inner side second conductor layer (58S) and the inner side fourth conductor layer (158S) to each other (FIG. 6A). The inner side fourth conductor layer (158S) includes the inner side fourth metal foil (32gs), the inner side fourth seed layer (42gs) on the inner side fourth metal foil (32gs), and the inner side fourth electrolytic plating film (44gs) on the inner side fourth seed layer (42gs).

The inner side fourth metal foil (32gs) has a fourth mat surface (32gsm) at an interface between the fourth resin insulating layer (150S) and the inner side fourth metal foil (32gs). The roughness (RzUI2) of the fourth mat surface (32gsm) is 1.5 µm or more and 2.0 µm or less.

The thickness (Gs) of the inner side fourth conductor layer (158S) is 5 µm or more and 25 µm or less. The thickness (G2) of the inner side fourth metal foil (32gs) is 2 m or more and 5 µm or less, and the thickness (g2) of the inner side fourth electrolytic plating film (44gs) is 5 µm or more and 25 µm or less.

The outermost first resin insulating layer (250F) and the outermost first metal foil (32uf) are sequentially laminated on the third resin insulating layer (150F) and the inner side third conductor layer (158F). The outermost first metal foil (32uf) has an outermost first mat surface (32ufm) at an interface between the outermost first resin insulating layer (250F) and the outermost first metal foil (32uf). The roughness (RzO1) of the outermost first mat surface (32ufm) is 3.5 µm or more and 4.5 µm or less. The roughness (RzO1) is smaller than the roughness (Rz1).

The outermost second resin insulating layer (250S) and the outermost second metal foil (32us) are sequentially laminated on the fourth resin insulating layer (150S) and the inner side fourth conductor layer (158S). The outermost second metal foil (32us) has an outermost second mat surface (32usm) at an interface between the outermost second resin insulating layer (250S) and the outermost second metal foil (32us). The roughness (RzO2) of the outermost second mat surface (32usm) is 3.5 µm or more and 4.5 µm or less. The roughness (RzO2) is smaller than the roughness (Rz1).

CO2 gas laser is irradiated to the outermost first metal foil (32uf). Openings (251F) are formed penetrating the outermost first metal foil (32uf) and the outermost first resin insulating layer (250F) and reaching the inner side third conductor layer (158F).

Figure 6B:
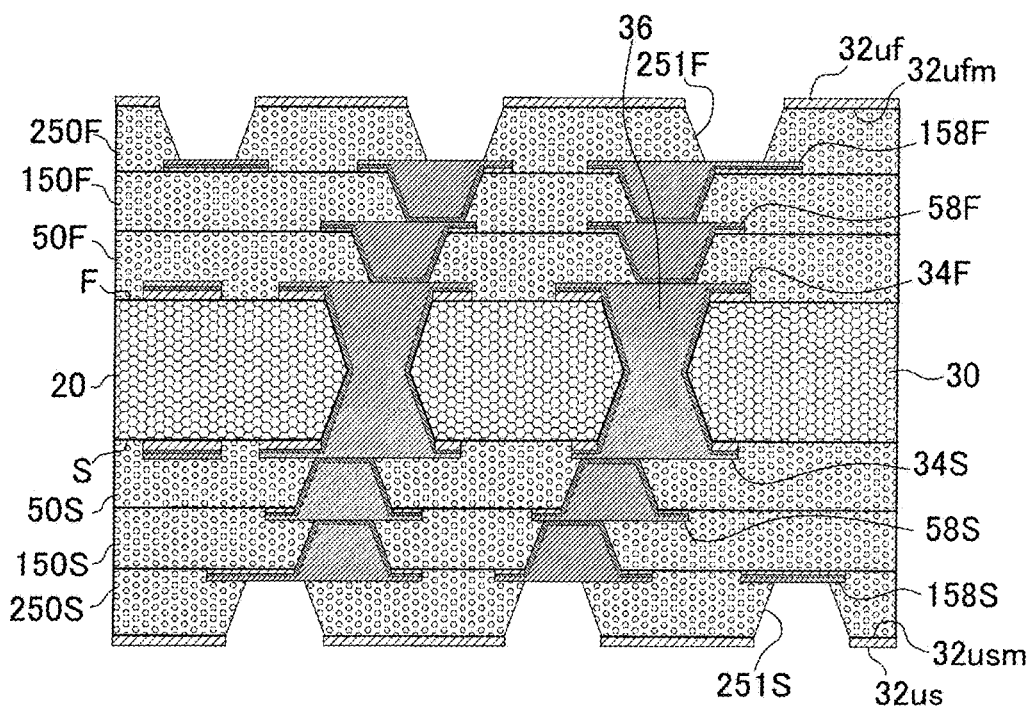

CO2 gas laser is irradiated to the outermost second metal foil (32us). Openings (251S) are formed penetrating the outermost second metal foil (32us) and the outermost second resin insulating layer (250S) and reaching the inner side fourth conductor layer (158S) (FIG. 6B).

By an electroless plating treatment, the outermost first seed layer (42uf) is formed on the outermost first metal foil (32uf) and on inner walls of the openings (251F). The outermost second seed layer (42us) is formed on the outermost second metal foil (32us) and on inner walls of the openings (251S). By an electrolytic plating treatment, the outermost first electrolytic plating film (44uf) is formed on the outermost first seed layer (42uf). At the same time, the outermost first via conductors (260F) are respectively formed in the openings (251F). At the same time, the outermost second electrolytic plating film (44us) is formed on the outermost second seed layer (42us). The outermost second via conductors (260S) are respectively formed in the openings (251S). An etching resist (48uf) is formed on the outermost first electrolytic plating film (44uf). An etching resist (48us) is formed on the outermost second electrolytic plating film (44us) (FIG. 7A). The outermost first electrolytic plating film (44uf), the outermost first seed layer (42uf) and the outermost first metal foil (32uf) exposed from the etching resist (48uf) are removed by etching. The outermost first conductor layer (258F) is formed using a subtractive method. The outermost second electrolytic plating film (44us), the outermost second seed layer (42us) and the outermost second metal foil (32us) exposed from the etching resist (48us) are removed by etching. The outermost second conductor layer (258S) is formed using a subtractive method. The etching resists (48uf, 48us) are removed (FIG. 7B). The first build-up layer (Bu1) is formed on the first surface (F) of the core substrate 30, and the second build-up layer (Bu2) is formed on the second surface (S) of the core substrate 30.

The outermost first conductor layer (258F) includes the outermost first metal foil (32uf), the outermost first seed layer (42uf) on the outermost first metal foil (32uf), and the outermost first electrolytic plating film (44uf) on the outermost first seed layer (42uf). The outermost second conductor layer (258S) includes the outermost second metal foil (32us), the outermost second seed layer (42us) on the outermost second metal foil (32us), and the outermost second electrolytic plating film (44us) on the outermost second seed layer (42us).

The thickness (Uf) of the outermost first conductor layer (258F) is 15 µm or more and 35 µm or less. The thickness (U1) of the outermost first metal foil (32uf) is 2 µm or more and 15 µm or less, and the thickness (u1) of the outermost first electrolytic plating film (44uf) is 1 µm or more and 12 µm or less.

The thickness (Us) of the outermost second conductor layer (258S) is 15 µm or more and 35 µm or less. The thickness (U2) of the outermost second metal foil (32us) is 2 µm or more and 15 µm or less, and the thickness (u2) of the outermost second electrolytic plating film (44us) is 1 µm or more and 12 µm or less.

Figure 1B:
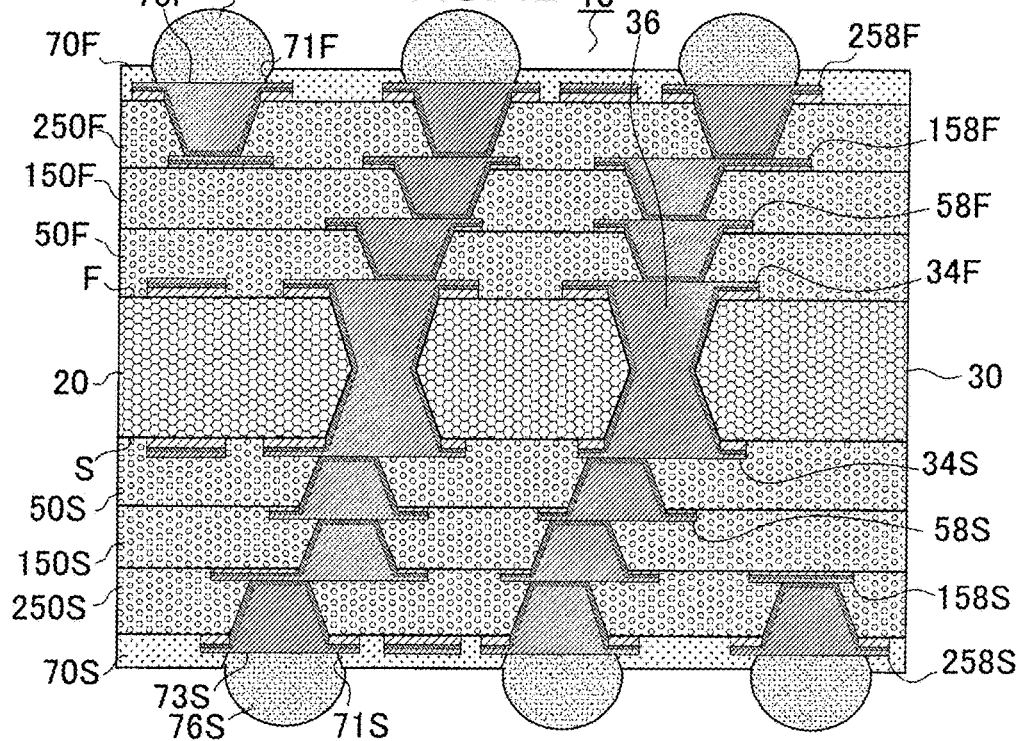

The first solder resist layer (70F) having the first openings (71F) exposing the first pads (73F) included in the outermost first conductor layer (258F) is formed on the first build-up layer (Bu1). The second solder resist layer (70S) having the second openings (71S) exposing the second pads (73S) included in the outermost second conductor layer (258S) is formed on the second build-up layer (Bu2) (FIG. 1A). First solder bumps (76F) are respectively formed by reflow on the first pads (73F) exposed from the first openings (71F). Second solder bumps (76S) are respectively formed by reflow on the second pads (73S) exposed from the second openings (71S). The printed wiring board 10 having the solder bumps is completed (FIG. 1B).

The first build-up layer (Bu1) has multiple inner side conductor layers, and the second build-up layer (Bu2) has multiple inner side conductor layers. The inner side conductor layers are conductor layers other than the outermost conductor layers among the conductor layers included in the build-up layers.

Figure 8:
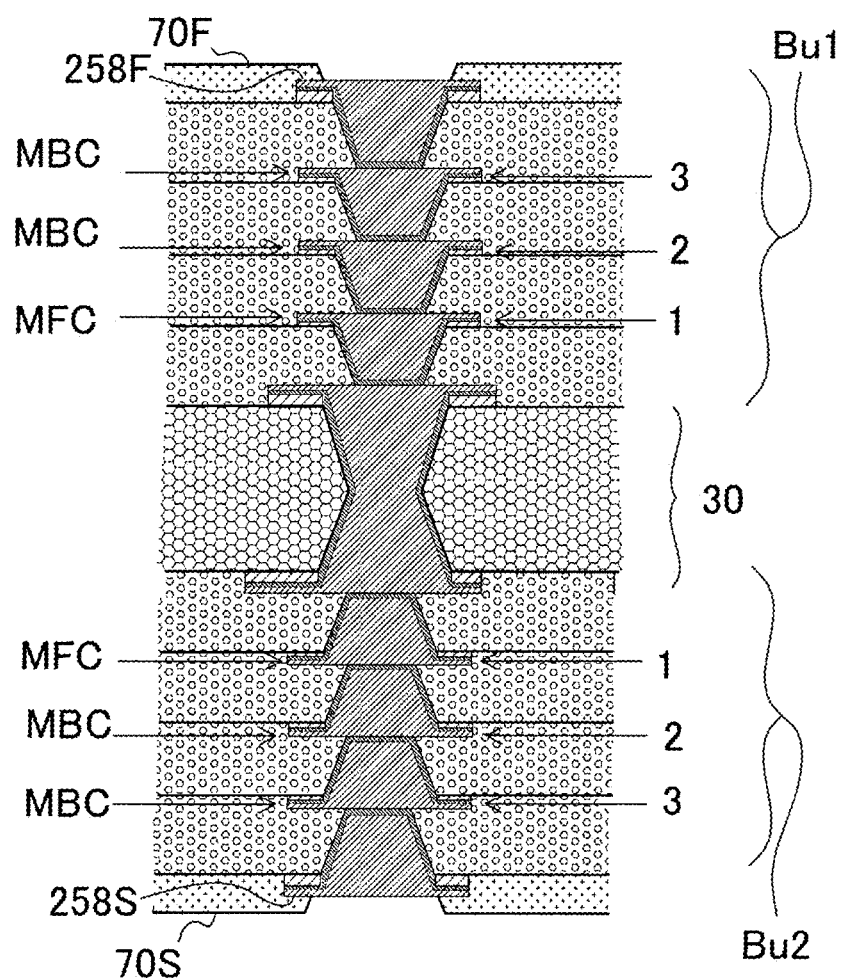
FIG. 8 is an explanatory diagram of the printed wiring board of the embodiment.

The first build-up layer (Bu1) has multiple inner side conductor layers. The inner side conductor layers include one or more conductor layers (MFC) each formed by a metal foil having a mat surface having a small rough surface and one or more conductor layers (MBC) each formed by a metal foil having a mat surface having a large rough surface. And, the second build-up layer (Bu2) has multiple inner side conductor layers. The inner side conductor layers include one or more conductor layers (MFC) each formed by a metal foil having a mat surface having a small rough surface and one or more conductor layers (MBC) each formed by a metal foil having a mat surface having a large rough surface. In this case, the one or more inner side conductor layers each formed by a metal foil having a mat surface having a small rough surface in the first build-up layer (Bu1) and the one or more inner side conductor layers each formed by a metal foil having a mat surface having a small rough surface in the second build-up layer (Bu2) are symmetrically formed with respect to the core substrate. An example of this case is illustrated in FIG. 8. In FIG. 8, numbers are sequentially assigned to the conductor layers. The number "1" is assigned to the inner side conductor layers closest to the core substrate 30, and the largest number is assigned to the inner side conductor layers closest to the outermost conductor layers (258F, 258S).

As illustrated in FIG. 8, when the inner side conductor layer indicated by the number "1" in the first build-up layer (Bu1) is a conductor layer (MFC) formed by a metal foil having a mat surface having a small rough surface, the inner side conductor layer indicated by the number "1" in the second build-up layer (Bu2) is a conductor layer (MFC) formed by a metal foil having a mat surface having a small rough surface. The other inner side conductor layers (2, 3) are conductor layers (MBC) each formed by a metal foil having a mat surface having a large rough surface. And, as illustrated in FIG. 8, when the inner side conductor layers respectively indicated by the numbers "2" and "3" in the first build-up layer (Bu1) are conductor layers (MFC) each formed by a metal foil having a mat surface having a large rough surface, the inner side conductor layers respectively indicated by the numbers "2" and "3" in the second build-up layer (Bu2) are conductor layers (MFC) each formed by a metal foil having a mat surface having a large rough surface. When the inner side conductor layer indicated by the number "3" in the first build-up layer (Bu1) is a conductor layer (MFC) formed by a metal foil having a mat surface having a small rough surface, the inner side conductor layer indicated by the number "3" in the second build-up layer (Bu2) is a conductor layer (MFC) formed by a metal foil having a mat surface having a small rough surface.

The seed layers are preferably each formed by an electroless copper plating film. The electrolytic plating films are preferably each formed by an electrolytic copper plating film.

A ratio ((a size of a mat surface having a large unevenness)/(a size of a mat surface having a small unevenness)) of a size of a mat surface having a large unevenness to a size of a mat surface having a small unevenness is 1.5 or more and 2.0 or less. A printed wiring board suitable for high-speed transmission can be provided.

A ratio (RTT) ((a thickness of a conductor layer having a large thickness)/(a thickness of a conductor layer having a small thickness)) of a thickness of a conductor layer having a large thickness to a thickness of a conductor layer having a small thickness is preferably 1.2 or more and 3 or less. When the ratio (RTT) is larger than 1 and less than 1.2, the adhesion strength cannot be significantly improved. When the ratio (RTT) exceeds 3, the change in the adhesion strength becomes small.

For example, when the ratio (RTT) is less than 1.2, the thicknesses of the two conductor layers being compared to each other are substantially equal to each other. For example, when the ratio (RTT) exceeds 1.2, the two conductor layers being compared to each other are classified into a conductor layer having a small thickness and a conductor layer having a large thickness.

A thickness of a conductor layer and a thickness of a metal foil forming the conductor layer are related to each other. A conductor layer having a large thickness is formed by a metal foil having a large thickness, and a conductor layer having a small thickness is formed by a metal foil having a small thickness. A thickness of a metal foil having a large thickness is larger than a thickness of a metal foil having a small thickness. A ratio ((a thickness of a metal foil having a large thickness)/(a thickness of a metal foil having a small thickness)) of a thickness of a metal foil having a large thickness to a thickness of a metal foil having a small thickness is preferably 1.2 or more.

A thickness of a conductor layer and a thickness of an electrolytic plating film forming the conductor layer are related to each other. A conductor layer having a large thickness is formed by an electrolytic plating film having a small thickness, and a conductor layer having a small thickness is formed by an electrolytic plating film having a large thickness. A thickness of an electrolytic plating film having a large thickness is larger than a thickness of an electrolytic plating film having a small thickness. A ratio ((a thickness of an electrolytic plating film having a large thickness)/(a thickness of an electrolytic plating film having a small thickness)) of a thickness of an electrolytic plating film having a large thickness to a thickness of an electrolytic plating film having a small thickness is preferably 1.2 or more.

A thickness of a conductor layer and a size of an unevenness of a mat surface of a metal foil forming the conductor layer are related to each other. A conductor layer having a large thickness is formed by a metal foil having a large unevenness, and a conductor layer having a small thickness is formed by a metal foil having a small unevenness. A size of an unevenness is represented, for example, by a ten-point average roughness. A size of a large unevenness is larger than a size of a small unevenness. A ratio ((a size of a large unevenness)/(a size of a small unevenness)) of a size of a large unevenness to a size of a small unevenness is preferably 1.2 or more.

In the printed wiring board 10 of the embodiment, the conductor layers of the core substrate and the outermost conductor layers belong to the conductor layers each having a large thickness. An inner side conductor layer belongs to either a conductor layer having a large thickness or a conductor layer having a small thickness. The thicknesses of the inner side conductor layers each having a large thickness are substantially equal to the thicknesses of the conductor layers of the core substrate.

A thickness of a metal foil forming a conductor layer and a thickness of an electrolytic plating film forming the conductor layer are related to each other. When the thickness of the metal foil is large, the thickness of the electrolytic plating film is small. Therefore, for a conductor layer having a small thickness, a ratio ((the thickness of the metal foil)/(the thickness of the electrolytic plating film)) of the thickness of the metal foil to the thickness of the electrolytic plating film is smaller than 1. Conversely, for a conductor layer having a large thickness, the ratio ((the thickness of the metal foil)/(the thickness of the electrolytic plating film)) is larger than 1.

The thicknesses of the conductor layers (34F, 34S) forming the core substrate 30 are 15 µm or more and 35 µm or less. The thicknesses of the metal foils forming the conductor layers of the core substrate are 2 µm or more and 15 µm or less. The thicknesses of the electrolytic plating films forming the conductor layers of the core substrate are 1 µm or more and 12 µm or less. The ten-point average roughnesses (Rz) of the unevennesses of the mat surfaces of the metal foils forming the conductor layers of the core substrate are 3.0 µm or more and 5.0 µm or less.

The thicknesses of the outermost conductor layers (258F, 258S) are 15 µm or more and 35 µm or less. The thicknesses of the metal foils forming the outermost conductor layers are 2 µm or more and 15 µm or less. The thicknesses of the electrolytic plating films forming the outermost conductor layers are 1 µm or more and 12 µm or less. The ten-point average roughnesses (Rz) of the unevennesses of the mat surfaces of the metal foils forming the outermost conductor layers are 3.0 µm or more and 5.0 µm or less. The thicknesses of the metal foils forming the outermost conductor layers can be made smaller than the thicknesses of the metal foils forming the conductor layers of the core substrate. The ten-point average roughnesses of the unevennesses of the mat surfaces of the metal foils forming the outermost conductor layers can be made smaller than the ten-point average roughnesses of the unevennesses of the mat surfaces of the metal foils forming the conductor layers of the core substrate.

An example of an inner side conductor layer having a small thickness is described below.

A thickness of an inner side conductor layer having a small thickness is 5 µm or more and 25 µm or less. A thickness of a metal foil forming an inner side conductor layer having a small thickness is 2 µm or more and 5 µm or less. A thickness of an electrolytic plating film forming an inner side conductor layer having a small thickness is 5 µm or more and 25 µm or less. A ten-point average roughness (Rz) of an unevenness of a mat surface of a metal foil forming an inner side conductor layer having a small thickness is 1.5 µm or more and 2.5 µm or less.

An example of an inner side conductor layer having a large thickness is described below.

A thickness of an inner side conductor layer having a large thickness is 15 µm or more and 35 µm or less. A thickness of a metal foil forming an inner side conductor layer having a large thickness is 2 µm or more and 15 µm or less. A thickness of an electrolytic plating film forming an inner side conductor layer having a large thickness is 1 µm or more and 12 µm or less. A ten-point average roughness (Rz) of an unevenness of a mat surface of a metal foil forming an inner side conductor layer having a large thickness is 3.0 µm or more and 5.0 µm or less.

According to the printed wiring board 10 of the embodiment, a difference between a transmission speed of data transmitted by a conductor layer having a large thickness and a transmission speed of data transmitted by a conductor layer having a small thickness can be reduced. For example, a malfunction of an electronic component can be prevented.

According to the printed wiring board 10 of the embodiment, a difference between a transmission speed of data transmitted by a conductor layer formed by a metal foil having a large unevenness and a transmission speed of data transmitted by a conductor layer formed by a metal foil having a small unevenness can be reduced. For example, a malfunction of an electronic component can be prevented.

Japanese Patent Laid-Open Publication No. 2012-156525 describes a multilayer printed wiring board in FIG. 2A. In the printed wiring board, insulating layers and conductor layers are alternately laminated, and adjacent conductor layers are connected to each other by via holes formed in the insulating layers. Further, Japanese Patent Laid-Open Publication No. 2012-156525 describes a method for manufacturing the multilayer printed wiring board in FIG. 9A-9E, 10A-10E, 11, and 12A-12B. According to FIG. 9B of Japanese Patent Laid-Open Publication No. 2012-156525, openings for via hole formation reaching a copper foil are formed in an insulating layer. Thereafter, the via holes are respectively formed in the openings. Thereafter, as illustrated in FIG. 9E, conductor layers are formed on both sides of the insulating layer. Then, by alternately laminating insulating layers and conductor layers on both sides of the circuit substrate of FIG. 9E, the multilayer printed wiring board illustrated in FIG. 12A of Japanese Patent Laid-Open Publication No. 2012-156525 is manufactured.

Japanese Patent Laid-Open Publication No. 2012-156525 describes a multilayer printed wiring board. According to a manufacturing method illustrated in FIG. 9A-9E, 10A-10E, 11, and 12A-12B of Japanese Patent Laid-Open Publication No. 2012-156525, in Japanese Patent Laid-Open Publication No. 2012-156525, the circuit substrate of FIG. 9E is thought to be a core substrate. Then, the core substrate has the via holes reaching the copper foil. For example, when the multilayer printed wiring board illustrated in FIG. 12A of Japanese Patent Laid-Open Publication No. 2012-156525 is subjected to a stress due to heat cycles, the circuit substrate (core substrate) illustrated in FIG. 9E is thought to be subjected to a large stress. In particular, a stress acting on interfaces between bottom surfaces of the via holes formed in the circuit substrate (core substrate) illustrated in FIG. 9E of Japanese Patent Laid-Open Publication No. 2012-156525 and the copper foil (conductor circuits) in contact with the bottom surfaces is thought to be large. Due to the stress, connection reliability between the bottom surfaces of the via holes in the circuit substrate (core substrate) illustrated in FIG. 9E and the copper foil (conductor circuits) is expected to decrease.

A printed wiring board according to a first aspect of the present invention includes: a core substrate having a core layer having a first surface and a second surface on an opposite side with respect to the first surface, through holes for through-hole conductors each formed by a first opening tapering from the first surface toward the second surface and a second opening tapering from the second surface toward the first surface, the through-hole conductors respectively formed in the through holes, first through-hole lands formed on the first surface and respectively directly connected to the through-hole conductors, and second through-hole lands formed on the second surface and respectively directly connected to the through-hole conductors; a first resin insulating layer formed on the first surface and on the first through-hole lands; a second resin insulating layer formed on the second surface and on the second through-hole lands; first via conductors penetrating the first resin insulating layer and respectively connecting to the first through-hole lands; second via conductors penetrating the second resin insulating layer and respectively connecting to the second through-hole lands; first via lands formed on the first resin insulating layer and respectively directly connected to the first via conductors; second via lands formed on the second resin insulating layer and respectively directly connected to the second via conductors; an outermost first resin insulating layer formed on the first resin insulating layer and on the first via lands; an outermost second resin insulating layer formed on the second resin insulating layer and on the second via lands; an outermost first conductor layer formed on the outermost first resin insulating layer; an outermost second conductor layer formed on the outermost second resin insulating layer; outermost first via conductors penetrating the outermost first resin insulating layer and respectively electrically connecting to the first via conductors; and outermost second via conductors penetrating the outermost second resin insulating layer and respectively electrically connecting to the second via conductors. Through-hole structures are formed by the through-hole conductors, the first through-hole lands and the second through-hole lands. The through-hole conductors each have a joining area at an intersection between the first opening and the second opening. The first through-hole lands are formed by a first metal foil, a first seed layer on the first metal foil, and a first electrolytic plating film on the first seed layer. The second through-hole lands are formed by a second metal foil, a second seed layer on the second metal foil, and a second electrolytic plating film on the second seed layer. The first via lands are formed by an inner side first metal foil, an inner side first seed layer on the inner side first metal foil, and an inner side first electrolytic plating film on the inner side first seed layer. The second via lands are formed by an inner side second metal foil, an inner side second seed layer on the inner side second metal foil, and an inner side second electrolytic plating film on the inner side second seed layer. The outermost first conductor layer is formed by an outermost first metal foil, an outermost first seed layer on the outermost first metal foil, and an outermost first electrolytic plating film on the outermost first seed layer. The outermost second conductor layer is formed by an outermost second metal foil, an outermost second seed layer on the outermost second metal foil, and an outermost second electrolytic plating film on the outermost second seed layer. The first metal foil has a first mat surface at an interface between the first surface of the core layer and the first metal foil. The second metal foil has a second mat surface at an interface between the second surface of the core layer and the second metal foil. The inner side first metal foil has an inner side first mat surface at an interface between the first resin insulating layer and the inner side first metal foil. The inner side second metal foil has an inner side second mat surface at an interface between the second resin insulating layer and the inner side second metal foil. The outermost first metal foil has an outermost first mat surface at an interface between the outermost first resin insulating layer and the outermost first metal foil. The outermost second metal foil has an outermost second mat surface at an interface between the outermost second resin insulating layer and the outermost second metal foil. A ten-point average roughness (RzI1) of an unevenness of the inner side first mat surface is smaller than a ten-point average roughness (Rz1) of an unevenness of the first mat surface, a ten-point average roughness (Rz2) of an unevenness of the second mat surface, a ten-point average roughness (RzO1) of an unevenness of the outermost first mat surface, and a ten-point average roughness (RzO2) of an unevenness of the outermost second mat surface. A ten-point average roughness (RzI2) of an unevenness of the inner side second mat surface is smaller than the ten-point average roughness (Rz1) of the unevenness of the first mat surface, the ten-point average roughness (Rz2) of the unevenness of the second mat surface, the ten-point average roughness (RzO1) of the unevenness of the outermost first mat surface, and the ten-point average roughness (RzO2) of the unevenness of the outermost second mat surface.

A printed wiring board according to a second aspect of the present invention includes: a core substrate having a core layer having a first surface and a second surface on an opposite side with respect to the first surface, a first conductor layer formed on the first surface, and a second conductor layer formed on the second surface; a first resin insulating layer formed on the first surface and the first conductor layer; a second resin insulating layer formed on the second surface and the second conductor layer; an inner side first conductor layer formed on the first resin insulating layer; an inner side second conductor layer formed on the second resin insulating layer; an outermost first resin insulating layer formed on the first resin insulating layer and the inner side first conductor layer; an outermost second resin insulating layer formed on the second resin insulating layer and the inner side second conductor layer; an outermost first conductor layer formed on the outermost first resin insulating layer; and an outermost second conductor layer formed on the outermost second resin insulating layer. The first conductor layer is formed by a first metal foil, a first seed layer on the first metal foil, and a first electrolytic plating film on the first seed layer. The second conductor layer is formed by a second metal foil, a second seed layer on the second metal foil, and a second electrolytic plating film on the second seed layer. The inner side first conductor layer is formed by an inner side first metal foil, an inner side first seed layer on the inner side first metal foil, and an inner side first electrolytic plating film on the inner side first seed layer. The inner side second conductor layer is formed by an inner side second metal foil, an inner side second seed layer on the inner side second metal foil, and an inner side second electrolytic plating film on the inner side second seed layer. The outermost first conductor layer is formed by an outermost first metal foil, an outermost first seed layer on the outermost first metal foil, and an outermost first electrolytic plating film on the outermost first seed layer. The outermost second conductor layer is formed by an outermost second metal foil, an outermost second seed layer on the outermost second metal foil, and an outermost second electrolytic plating film on the outermost second seed layer. The first metal foil has a first mat surface at an interface between the first surface of the core layer and the first metal foil. The second metal foil has a second mat surface at an interface between the second surface of the core layer and the second metal foil. The inner side first metal foil has an inner side first mat surface at an interface between the first resin insulating layer and the inner side first metal foil. The inner side second metal foil has an inner side second mat surface at an interface between the second resin insulating layer and the inner side second metal foil. The outermost first metal foil has an outermost first mat surface at an interface between the outermost first resin insulating layer and the outermost first metal foil. The outermost second metal foil has an outermost second mat surface at an interface between the outermost second resin insulating layer and the outermost second metal foil. A ten-point average roughness (RzI1) of an unevenness of the inner side first mat surface is smaller than a ten-point average roughness (Rz1) of an unevenness of the first mat surface, a ten-point average roughness (Rz2) of an unevenness of the second mat surface, a ten-point average roughness (RzO1) of an unevenness of the outermost first mat surface, and a ten-point average roughness (RzO2) of an unevenness of the outermost second mat surface. A ten-point average roughness (RzI2) of an unevenness of the inner side second mat surface is smaller than the ten-point average roughness (Rz1) of the unevenness of the first mat surface, the ten-point average roughness (Rz2) of the unevenness of the second mat surface, the ten-point average roughness (RzO1) of the unevenness of the outermost first mat surface, and the ten-point average roughness (RzO2) of the unevenness of the outermost second mat surface.

According to an embodiment of the present invention, the size (depth) of the unevenness (roughness) of the first mat surface of the first metal foil is larger than the size (depth) of the unevenness (roughness) of the inner side first mat surface of the inner side first metal foil. Therefore, even when a stress that occurs due to that the inner side first mat surface of the inner side first metal foil forming the first via lands is formed in the first resin insulating layer is transmitted to the interface between the first metal foil forming the first through-hole lands and the core layer, the stress is thought to be smaller than the bonding strength between the first through-hole lands and the core layer. Therefore, it is thought that the through-hole conductors will not peel off from the core layer.

When a residual stress is released, for example, the stress is transmitted to the outermost conductor layers via the through-hole conductors and the via conductors. Due to the stress, it is thought that peeling occurs between the outermost conductor layers and the outermost resin insulating layers. However, in the printed wiring board of the embodiment, the unevennesses of the mat surfaces of the metal foils forming the outermost conductor layers are larger than the unevennesses of the mat surfaces of the metal foils forming the inner side conductor layers. Therefore, the peeling is unlikely to occur.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a core substrate;
   a first build-up layer formed on a first surface side of the core substrate; and
   a second build-up layer formed on a second surface side of the core substrate on an opposite side with respect to the first surface side,
   wherein the core substrate includes a core layer having a plurality of through holes, a plurality of through-hole conductors formed in the plurality of through holes respectively such that each of the through holes has a first opening tapering from a first surface of the core layer toward a second surface of the core layer on an opposite side with respect to the first surface, and a second opening tapering from the second surface of the core layer toward the first surface of the core layer, a plurality of first through-hole lands formed on the first surface of the core layer such that the first through-hole lands are directly connected to the through-hole conductors respectively, and a plurality of second through-hole lands formed on the second surface of the core layer such that the second through-hole lands are directly connected to the through-hole conductors respectively, the first build-up layer includes a first resin insulating layer, a plurality of first via conductors penetrating through the first resin insulating layer and connecting to the first through-hole lands respectively, a plurality of first via lands formed on the first resin insulating layer and directly connected to the first via conductors respectively, an outermost first resin insulating layer formed on the first resin insulating layer, an outermost first conductor layer formed on the outermost first resin insulating layer, and a plurality of outermost first via conductors penetrating through the outermost first resin insulating layer and electrically connecting to the first via conductors respectively, the second build-up layer includes a second resin insulating layer, a plurality of second via conductors penetrating through the second resin insulating layer and connecting to the second through-hole lands respectively, a plurality of second via lands formed on the second resin insulating layer and directly connected to the second via conductors respectively, an outermost second resin insulating layer formed on the second resin insulating layer, an outermost second conductor layer formed on the outermost second resin insulating layer, and a plurality of outermost second via conductors penetrating through the outermost second resin insulating layer and electrically connecting to the second via conductors respectively, the through-hole conductors, first through-hole lands and second through-hole lands form a plurality of through-hole structures such that each of the through-hole conductors has a joining area at an intersection between the first opening and the second opening, each of the first through-hole lands, second through-hole lands, first via lands, second via lands, outermost first conductor layer and outermost second conductor layer comprises a metal foil, a seed layer formed on the metal foil, and an electrolytic plating film formed on the seed layer, and the metal foil of the first via lands has a mat surface at the first surface of the core layer, the metal foil of the second via lands has a mat surface on the second surface of the core layer, the metal foil of the first via lands has a mat surface on the first resin insulating layer, the metal foil of the second via lands has a mat surface on the second resin insulating layer, the metal foil of the outermost first conductor layer has a mat surface on the outermost first resin insulating layer, the metal foil of the second conductor layer has a mat surface on the outermost second resin insulating layer such that the mat surface of the first via lands has a ten-point average roughness RzI1 of an unevenness that is smaller than ten-point average roughness Rz1, Rz2, RzO1, RzO2 of an unevenness of the mat surfaces of the first through-hole lands, second through-hole lands, outermost first conductor layer, and outermost second conductor layer, and that the mat surface of the second via lands has a ten-point average roughness RzI2 of an unevenness that is smaller than ten-point average roughness Rz1, Rz2, RzO1, RzO2 of an unevenness of the mat surfaces of the first through-hole lands, second through-hole lands, outermost first conductor layer, and outermost second conductor layer.

2. The printed wiring board according to claim 1, wherein the first through-hole lands, second through-hole lands, outermost first conductor layer and outermost second conductor layer are formed such that the ten-point average roughness Rz1, Rz2, RzO1, RzO2 are substantially equal to each other.

3. The printed wiring board according to claim 2, wherein the first through-hole lands, second through-hole lands, outermost first conductor layer and outermost second conductor layer are formed such that Rz1/RzO1, Rz1/RzO2, Rz2/RzO1 and Rz2/RzO2 are in a range of 0.9 to 1.1.

4. The printed wiring board according to claim 1, wherein the first through-hole lands, second through-hole lands, outermost first conductor layer and outermost second conductor layer are formed such that Rz1/RzO1, Rz1/RzO2, Rz2/RzO1 and Rz2/RzO2 are in a range of 0.9 to 1.1.

5. The printed wiring board according to claim 1, wherein the first through-hole lands and outermost first conductor layer are formed such that the ten-point average roughness Rz1, RzO1 are substantially equal to each other, and the second through-hole lands and outermost second conductor layer are formed such that the ten-point average roughness Rz2, RzO2 are substantially equal to each other.

6. The printed wiring board according to claim 5, wherein the first through-hole lands and outermost first conductor layer are formed such that Rz1/RzO1 is in a range of 0.9 to 1.1, and the second through-hole lands and outermost second conductor layer are formed such that Rz2/RzO2 is in a range of 0.9 to 1.1.

7. The printed wiring board according to claim 1, wherein the first through-hole lands and outermost first conductor layer are formed such that the ten-point average roughness Rz1, RzO1 are substantially equal to each other.

8. The printed wiring board according to claim 7, wherein the first through-hole lands and outermost first conductor layer are formed such that Rz1/RzO1 is in a range of 0.9 to 1.1.

9. The printed wiring board according to claim 7, wherein the first through-hole lands and outermost first conductor layer are formed such that Rz1/RzO1 is in a range of 0.9 to 1.1.

10. The printed wiring board according to claim 1, wherein the first through-hole lands and second through-hole lands are formed such that the ten-point average roughness Rz1, Rz2 are substantially equal to each other, and the outermost first conductor layer and outermost second conductor layer are formed such that the ten-point average roughness RzO1, RzO2 are substantially equal to each other.

11. A printed wiring board, comprising:
a core substrate comprising a core layer, a first conductor layer formed on a first surface of the core layer, and a second conductor layer formed on a second surface of the core layer on an opposite side with respect to the first surface;
a first build-up layer formed on a first surface side of the core substrate and comprising a first resin insulating layer, an inner side first conductor layer formed on the first resin insulating layer, an outermost first resin insulating layer formed on the inner side first conductor layer, and an outermost first conductor layer formed on the outermost first resin insulating layer; and
a second build-up layer formed on a second surface side of the core substrate on an opposite side with respect to the first surface side and comprising a second resin insulating layer, an inner side second conductor layer formed on the second resin insulating layer, an outermost second resin insulating layer formed on the inner side second conductor layer, and an outermost second conductor layer formed on the outermost second resin insulating layer,
wherein each of the first conductor layer, second conductor layer, inner side first conductor layer, inner side second conductor layer, outermost first conductor layer and outermost second conductor layer comprises a metal foil, a seed layer formed on the metal foil, and an electrolytic plating film formed on the outermost second seed layer, and the metal foil of the first conductor layer has a mat surface at the first surface of the core layer, the metal foil of the second conductor layer has a mat surface on the second surface of the core layer, the metal foil of the inner side first conductor layer has a mat surface on the first resin insulating layer, the metal foil of the inner side second conductor layer has a mat surface on the second resin insulating layer, the metal foil of the outermost first conductor layer has a mat surface on the outermost first resin insulating layer, and the metal foil of the outermost second conductor layer has a mat surface on the outermost second resin insulating layer such that the mat surface of the inner side first conductor layer has a ten-point average roughness RzI1 of an unevenness that is smaller than ten-point average roughness Rz1, Rz2, RzO1, RzO2 of an unevenness of the mat surfaces of the first conductor layer, the second conductor layer, the outermost first conductor layer and the outermost second conductor layer, and that the mat surface of the inner side second conductor layer has a ten-point average roughness RzI2 of an unevenness that is smaller than ten-point average roughness Rz1, Rz2, RzO1, RzO2 of an unevenness of the mat surfaces of the first conductor layer, the second conductor layer, the outermost first conductor layer and the outermost second conductor layer.

12. The printed wiring board according to claim 11, wherein the first conductor layer, second conductor layer, outermost first conductor layer and outermost second conductor layer are formed to have thicknesses that are substantially equal to each other such that a ratio, (the thickness of the first conductor layer)/(a thickness of the inner side first conductor layer), is in a range of 1.2 to 3, and that a ratio, (the thickness of the first conductor layer)/(a thickness of the inner side second conductor layer), is in a range of 1.2 to 3.

13. The printed wiring board according to claim 12, wherein the first conductor layer, second conductor layer, outermost first conductor layer and outermost second conductor layer are formed such that thicknesses of the metal foils are substantially equal to each other, that the metal foil of the inner side first conductor layer has a thickness that is smaller than the thickness of the metal foil of the first conductor layer, and that the metal foil of the inner side second conductor layer has a thickness that is smaller than the thickness of the metal foil of the first conductor layer.

14. The printed wiring board according to claim 13, wherein the first and second conductor layers and outermost first conductor layer are formed such that the ten-point average roughness Rz1, Rz2 of the first and second conductor layers are larger than the ten-point average roughness RzO1 of the outermost first conductor layer, and the first and second conductor layers and the outermost second conductor layer are formed such that the ten-point average roughness Rz1, Rz2 of the first and second conductor layers are larger than the ten-point average roughness RzO2 of the outermost second conductor layer.

15. The printed wiring board according to claim 12, wherein the first and second conductor layers and outermost first conductor layer are formed such that the ten-point average roughness Rz1, Rz2 of the first and second conductor layers are larger than the ten-point average roughness RzO1 of the outermost first conductor layer, and the first and second conductor layers and the outermost second conductor layer are formed such that the ten-point average roughness Rz1, Rz2 of the first and second conductor layers are larger than the ten-point average roughness RzO2 of the outermost second conductor layer.

16. The printed wiring board according to claim 11, wherein the first and second conductor layers and outermost first conductor layer are formed such that the ten-point average roughness Rz1, Rz2 of the first and second conductor layers are larger than the ten-point average roughness RzO1 of the outermost first conductor layer, and the first and second conductor layers and the outermost second conductor layer are formed such that the ten-point average roughness Rz1, Rz2 of the first and second conductor layers are larger than the ten-point average roughness RzO2 of the outermost second conductor layer.

17. The printed wiring board according to claim 11, wherein the first conductor layer is formed to have a thickness such that a ratio, (the thickness of the first conductor layer)/(a thickness of the inner side first conductor layer), is in a range of 1.2 to 3, and that a ratio, (the thickness of the first conductor layer)/(a thickness of the inner side second conductor layer), is in a range of 1.2 to 3.

18. The printed wiring board according to claim 17, wherein the first conductor layer is formed such that the metal foil of the inner side first conductor layer has a thickness that is smaller than the thickness of the metal foil of the first conductor layer, and that the metal foil of the inner side second conductor layer has a thickness that is smaller than the thickness of the metal foil of the first conductor layer.

19. The printed wiring board according to claim 17, wherein the first and second conductor layers and outermost first conductor layer are formed such that the ten-point average roughness Rz1, Rz2 of the first and second conductor layers are larger than the ten-point average roughness RzO1 of the outermost first conductor layer, and the first and second conductor layers and the outermost second conductor layer are formed such that the ten-point average roughness Rz1, Rz2 of the first and second conductor layers are larger than the ten-point average roughness RzO2 of the outermost second conductor layer.

20. The printed wiring board according to claim 17, wherein the first and second conductor layers and outermost first conductor layer are formed such that the ten-point average roughness Rz1, Rz2 of the first and second conductor layers are larger than the ten-point average roughness RzO1 of the outermost first conductor layer.

* * * * *